US009622361B2

(12) United States Patent
Bentley et al.

(10) Patent No.: US 9,622,361 B2
(45) Date of Patent: Apr. 11, 2017

(54) ENCLOSURE AND MOUNT FOR MOTION CAPTURE ELEMENT

(71) Applicant: BLAST MOTION, INC., Encinitas, CA (US)

(72) Inventors: Michael Bentley, Encinitas, CA (US); Ryan Kaps, Fountain Hills, AZ (US); Bhaskar Bose, Carlsbad, CA (US); Joseph Scarbo, Rancho Margarita, CA (US)

(73) Assignee: BLAST MOTION INC., Carlsbad, CA (US)

( * ) Notice: Subject to any disclaimer, the term of this patent is extended or adjusted under 35 U.S.C. 154(b) by 114 days.

(21) Appl. No.: 13/688,213

(22) Filed: Nov. 29, 2012

(65) Prior Publication Data

US 2013/0095941 A1    Apr. 18, 2013

Related U.S. Application Data

(63) Continuation-in-part of application No. 13/306,869, filed on Nov. 29, 2011, which is a
(Continued)

(51) Int. Cl.
*H05K 5/02* (2006.01)
*A63B 53/00* (2015.01)
(Continued)

(52) U.S. Cl.
CPC ....... *H05K 5/0204* (2013.01); *A63B 24/0003* (2013.01); *A63C 11/00* (2013.01);
(Continued)

(58) Field of Classification Search
CPC . A63B 69/36; A63B 69/3614; A63B 69/3632; A63B 2017/0647; A63B 2220/10;
(Continued)

(56) References Cited

U.S. PATENT DOCUMENTS 1,712,537 A    5/1925    White
2,038,840 A    4/1936    Hall
(Continued)

FOREIGN PATENT DOCUMENTS

CA    2694123    8/2011
KR    20070120443    12/2007
(Continued)

OTHER PUBLICATIONS

International Preliminary Report on Patentability, received for PCT Patent Appl. No. PCT/US2012/066915, dated Jun. 12, 2014, 7 pages.
(Continued)

*Primary Examiner* — Lawrence Galka
(74) *Attorney, Agent, or Firm* — ARC IP Law, PC; Joseph J. Mayo

(57) ABSTRACT

Enables coupling or retrofitting a golf club with active motion capture electronics that are battery powered, passive or active shot count components, for example a passive RFID, and/or a visual marker on the cap for use with visual motion capture cameras. Does not require modifying the golf club. Electronics package and battery can be easily removed and replaced, for example without any tools. May utilize a weight that is removed when inserting the electronic package in the mount, wherein the weight element may have the same weight as an electronics package, for no net change or minimal change in club weight. May be implemented with a shaft enclosure and expander that may be coupled with a screw aligned along an axis parallel to the axis of the shaft. May utilize non-permanently and/or friction coupling between the mount and shaft. Cap may include a visual marker and/or logo.

20 Claims, 34 Drawing Sheets

Related U.S. Application Data continuation-in-part of application No. 13/191,309, filed on Jul. 26, 2011, which is a continuation-in-part of application No. 13/048,850, filed on Mar. 15, 2011, now Pat. No. 8,465,376, which is a continuation-in-part of application No. 12/901,806, filed on Oct. 11, 2010, which is a continuation-in-part of application No. 12/868,882, filed on Aug. 26, 2010.

(51) Int. Cl.

| | | |
|---|---|---|
| *H01Q 1/52* | (2006.01) | |
| *A63B 24/00* | (2006.01) | |
| *A63C 11/00* | (2006.01) | |
| *A63B 21/072* | (2006.01) | |
| *A63B 49/00* | (2015.01) | |
| *A63B 53/14* | (2015.01) | |
| *G01S 19/19* | (2010.01) | |
| *G01S 19/35* | (2010.01) | |
| *G01S 19/36* | (2010.01) | |
| *A63B 21/00* | (2006.01) | |
| *A63B 60/42* | (2015.01) | |

(52) U.S. Cl.
CPC ............ *H01Q 1/526* (2013.01); *H05K 5/02* (2013.01); *A63B 21/0724* (2013.01); *A63B 21/0726* (2013.01); *A63B 21/4035* (2015.10); *A63B 24/0021* (2013.01); *A63B 49/00* (2013.01); *A63B 53/00* (2013.01); *A63B 53/14* (2013.01); *A63B 60/42* (2015.10); *A63B 2220/12* (2013.01); *A63B 2220/17* (2013.01); *A63B 2220/40* (2013.01); *A63B 2220/806* (2013.01); *A63B 2225/15* (2013.01); *A63B 2225/20* (2013.01); *A63B 2225/50* (2013.01); *A63B 2225/54* (2013.01); *A63C 2203/18* (2013.01); *A63C 2203/22* (2013.01); *A63C 2203/24* (2013.01); *G01S 19/19* (2013.01); *G01S 19/35* (2013.01); *G01S 19/36* (2013.01)

(58) Field of Classification Search
CPC ............ A63B 2220/30; A63B 2220/40; A63B 2220/805; A63B 2220/806; A63B 2220/833; A63B 2200/836; A63B 2243/0029; A63B 2243/0083; A63B 24/0006; A63B 24/0021; A63B 71/0622; G06K 9/00342
USPC .................................. 473/219–222, 316, 407
See application file for complete search history.

(56) References Cited

U.S. PATENT DOCUMENTS

| | | | |
|---|---|---|---|
| 2,218,268 A | 10/1940 | Reid | |
| 3,788,647 A | 1/1964 | Evans | |
| 3,182,508 A | 5/1965 | Varju | |
| 3,223,555 A | 12/1965 | Himy et al. | |
| 3,226,704 A | 12/1965 | Petrash | |
| 3,270,564 A | 9/1966 | Evans | |
| 3,606,327 A | 9/1971 | Na | |
| 3,792,863 A | 2/1974 | Evans | |
| 3,806,131 A | 4/1974 | Evans | |
| 3,945,646 A | 3/1976 | Hammond | |
| 4,088,324 A | 5/1978 | Farmer | |
| D295,207 S | 4/1988 | Mahaffey | |
| 4,759,219 A | 7/1988 | Cobb et al. | |
| 4,898,389 A | 2/1990 | Plutt | |
| 4,910,677 A | 3/1990 | Remedio et al. | |
| 4,912,836 A | 4/1990 | Avetoom | |
| 4,940,236 A | 7/1990 | Allen | |
| 4,991,850 A | 2/1991 | Wilhlem | |
| 5,056,783 A | 10/1991 | Matcovich et al. | |
| 5,086,390 A | 2/1992 | Matthews | |
| 5,111,410 A | 5/1992 | Nakayama et al. | |
| 5,127,044 A | 6/1992 | Bonito et al. | |
| 5,184,295 A | 2/1993 | Mann | |
| 5,230,512 A | 7/1993 | Tattershall | |
| 5,233,544 A | 8/1993 | Kobayashi | |
| 5,249,967 A | 10/1993 | O'Leary et al. | |
| 5,259,620 A * | 11/1993 | Marocco | 473/224 |
| 5,283,733 A | 2/1994 | Colley | |
| 5,298,904 A | 3/1994 | Olich | |
| 5,332,225 A | 7/1994 | Ura | |
| 5,333,061 A | 7/1994 | Nakashima et al. | |
| 5,364,093 A | 11/1994 | Huston et al. | |
| 5,372,365 A | 12/1994 | McTeigue | |
| 5,422,798 A | 6/1995 | Osiecki et al. | |
| 5,441,256 A | 8/1995 | Hackman | |
| 5,441,269 A | 8/1995 | Henwood | |
| 5,460,372 A | 10/1995 | Cook | |
| 5,486,001 A | 1/1996 | Baker | |
| 5,524,081 A | 6/1996 | Paul | |
| 5,542,676 A * | 8/1996 | Howe et al. | 473/202 |
| 5,592,401 A | 1/1997 | Kramer | |
| 5,626,527 A * | 5/1997 | Eberlein | 473/203 |
| 5,632,484 A * | 5/1997 | Lambert | 473/241 |
| 5,638,300 A | 6/1997 | Johnson | |
| 5,665,006 A | 9/1997 | Pellegrini | |
| 5,688,183 A | 11/1997 | Sabatino et al. | |
| 5,694,340 A | 12/1997 | Kim | |
| 5,772,522 A | 6/1998 | Nesbit | |
| 5,779,555 A | 7/1998 | Nomura et al. | |
| 5,792,001 A | 8/1998 | Henwood | |
| 5,800,279 A * | 9/1998 | Densberger et al. | 473/220 |
| D399,282 S | 10/1998 | Jarrett | |
| 5,819,206 A | 10/1998 | Horton et al. | |
| 5,826,578 A | 10/1998 | Curchod | |
| 5,868,578 A | 2/1999 | Baum | |
| 5,904,484 A | 5/1999 | Burns | |
| 5,941,779 A | 8/1999 | Zeiner-Gundersen | |
| 5,973,596 A | 10/1999 | French et al. | |
| 6,007,439 A | 12/1999 | MacKay, Jr. | |
| 6,030,109 A | 2/2000 | Lobsenz | |
| 6,044,704 A | 4/2000 | Sacher | |
| 6,073,086 A | 6/2000 | Marinelli | |
| 6,224,493 B1 | 5/2001 | Lee et al. | |
| 6,244,356 B1 | 6/2001 | Luna | |
| 6,248,021 B1 | 6/2001 | Ognjanovic | |
| 6,293,802 B1 | 9/2001 | Ahlgren | |
| 6,366,205 B1 | 4/2002 | Sutphen | |
| 6,441,745 B1 | 8/2002 | Gates | |
| 6,443,860 B1 | 9/2002 | Byrne et al. | |
| 6,456,938 B1 | 9/2002 | Barnard | |
| 6,567,536 B2 | 5/2003 | McNitt | |
| 6,582,328 B2 | 6/2003 | Kuta et al. | |
| 6,697,761 B2 | 2/2004 | Akatsuka et al. | |
| 6,697,820 B1 | 2/2004 | Tarlie | |
| 6,705,942 B1 | 3/2004 | Crook et al. | |
| 6,709,352 B1 | 3/2004 | Albin | |
| 6,746,336 B1 | 6/2004 | Brant et al. | |
| 6,757,572 B1 | 6/2004 | Forest | |
| 6,774,932 B1 | 8/2004 | Ewing et al. | |
| 6,802,772 B1 | 10/2004 | Kunzle et al. | |
| 6,900,759 B1 | 5/2005 | Katayama | |
| 6,908,404 B1 | 6/2005 | Gard | |
| 6,923,729 B2 | 8/2005 | McGinty et al. | |
| 7,004,848 B2 | 2/2006 | Konow | |
| 7,021,140 B2 | 4/2006 | Perkins | |
| D522,078 S | 5/2006 | De Gruccio | |
| 7,037,198 B2 | 5/2006 | Hameen-Antilla | |
| D523,507 S | 6/2006 | Perry et al. | |
| 7,118,498 B2 | 10/2006 | Meadows et al. | |
| 7,121,962 B2 | 10/2006 | Reeves | |
| 7,143,639 B2 | 12/2006 | Gobush | |
| 7,160,200 B2 | 1/2007 | Grober | |
| 7,175,177 B2 | 2/2007 | Meifu et al. | |
| 7,184,151 B2 | 2/2007 | Clarke et al. | |
| 7,205,894 B1 | 4/2007 | Savage | |
| 7,219,033 B2 | 5/2007 | Kolen | |
| 7,234,351 B2 | 6/2007 | Perkins | |
| 7,264,098 B2 | 9/2007 | McPherson | |

(56) References Cited

U.S. PATENT DOCUMENTS

| | | |
|---|---|---|
| 7,264,554 B2 | 9/2007 | Bentley |
| 7,267,619 B1 | 9/2007 | Pettis |
| 7,433,805 B2 | 10/2008 | Vock et al. |
| 7,457,439 B1 | 11/2008 | Madsen et al. |
| 7,457,724 B2 | 11/2008 | Vock et al. |
| 7,481,716 B1 | 1/2009 | Johnson |
| 7,492,367 B2 | 2/2009 | Mahajan et al. |
| 7,494,236 B2 | 2/2009 | Lim |
| 7,561,989 B2 | 7/2009 | Banks |
| 7,623,987 B2 | 11/2009 | Vock et al. |
| 7,689,378 B2 | 3/2010 | Kolen |
| 7,713,148 B2 | 5/2010 | Sweeney |
| 7,736,242 B2 | 6/2010 | Stites et al. |
| 7,771,263 B2 | 8/2010 | Telford |
| 7,780,450 B2 | 8/2010 | Tarry |
| 7,800,480 B1 | 9/2010 | Joseph et al. |
| 7,813,887 B2 | 10/2010 | Vock et al. |
| 7,831,212 B1 | 11/2010 | Balardeta et al. |
| 7,871,333 B1 | 1/2011 | Davenport |
| 7,966,154 B2 | 6/2011 | Vock et al. |
| 7,983,876 B2 | 7/2011 | Vock et al. |
| 8,036,826 B2 | 10/2011 | MacIntosh et al. |
| 8,117,888 B2 | 2/2012 | Chan et al. |
| 8,172,722 B2 | 5/2012 | Molyneux et al. |
| 8,231,506 B2 | 7/2012 | Molyneux et al. |
| 8,249,831 B2 | 8/2012 | Vock et al. |
| 8,257,191 B2 | 9/2012 | Stites et al. |
| 8,348,783 B2 * | 1/2013 | Soracco et al. .............. 473/296 |
| 8,355,529 B2 | 1/2013 | Wu et al. |
| 8,425,292 B2 | 4/2013 | Lui et al. |
| 8,840,483 B1 | 9/2014 | Steuslof et al. |
| 2001/0029207 A1 | 10/2001 | Cameron et al. |
| 2001/0035880 A1 | 11/2001 | Musatov et al. |
| 2001/0045904 A1 | 11/2001 | Silzer, Jr. |
| 2002/0004723 A1 | 1/2002 | Meifu et al. |
| 2002/0019677 A1 | 2/2002 | Lee |
| 2002/0049507 A1 | 4/2002 | Hameen-Anttila |
| 2002/0052750 A1 | 5/2002 | Hirooka |
| 2002/0064764 A1 | 5/2002 | Fishman |
| 2002/0072815 A1 | 6/2002 | McDonough et al. |
| 2002/0077189 A1 | 6/2002 | Tuer et al. |
| 2002/0082775 A1 | 6/2002 | Meadows et al. |
| 2002/0150873 A1 | 10/2002 | Smith |
| 2002/0151994 A1 | 10/2002 | Sisco |
| 2002/0173364 A1 | 11/2002 | Boscha |
| 2002/0177490 A1 | 11/2002 | Yong et al. |
| 2002/0186132 A1 | 12/2002 | Kruger |
| 2002/0188359 A1 | 12/2002 | Morse |
| 2003/0008722 A1 | 1/2003 | Konow |
| 2003/0063292 A1 | 4/2003 | Mostafavi |
| 2004/0147329 A1 | 7/2004 | Meadows et al. |
| 2004/0224787 A1 * | 11/2004 | Lindner .............. 473/316 |
| 2004/0248676 A1 | 12/2004 | Taylor et al. |
| 2005/0032582 A1 | 2/2005 | Mahajan et al. |
| 2005/0054457 A1 | 3/2005 | Eyestone et al. |
| 2005/0177929 A1 | 8/2005 | Greenwald et al. |
| 2005/0215340 A1 | 9/2005 | Stites et al. |
| 2005/0227775 A1 | 10/2005 | Cassady et al. |
| 2005/0261073 A1 | 11/2005 | Farrington, Jr. et al. |
| 2005/0268704 A1 | 12/2005 | Bissonnette et al. |
| 2005/0272516 A1 | 12/2005 | Gobush |
| 2005/0282650 A1 | 12/2005 | Miettinen et al. |
| 2006/0025229 A1 | 2/2006 | Mahajan et al. |
| 2006/0063600 A1 | 3/2006 | Grober |
| 2006/0084516 A1 | 4/2006 | Eyestone et al. |
| 2006/0109116 A1 | 5/2006 | Keays |
| 2006/0122002 A1 * | 6/2006 | Konow .............. 473/223 |
| 2006/0166738 A1 | 7/2006 | Eyestone et al. |
| 2006/0199659 A1 | 9/2006 | Caldwell |
| 2006/0270450 A1 | 11/2006 | Garratt et al. |
| 2006/0276256 A1 | 12/2006 | Storek |
| 2007/0081695 A1 * | 4/2007 | Foxlin et al. .............. 382/103 |
| 2007/0087866 A1 | 4/2007 | Meadows et al. |
| 2007/0099715 A1 | 5/2007 | Jones et al. |
| 2007/0111811 A1 | 5/2007 | Grober |
| 2007/0129178 A1 | 6/2007 | Reeves |
| 2007/0135225 A1 | 6/2007 | Nieminen |
| 2007/0135237 A1 | 6/2007 | Reeves |
| 2007/0270214 A1 | 11/2007 | Bentley et al. |
| 2007/0298896 A1 | 12/2007 | Nusbaum et al. |
| 2008/0305895 A1 | 12/2008 | Gant |
| 2009/0017944 A1 | 1/2009 | Savarese et al. |
| 2009/0036237 A1 | 2/2009 | Nipper et al. |
| 2009/0111602 A1 * | 4/2009 | Savarese et al. .............. 473/283 |
| 2009/0137333 A1 | 5/2009 | Lin et al. |
| 2009/0177097 A1 | 7/2009 | Ma et al. |
| 2009/0209343 A1 * | 8/2009 | Foxlin et al. .............. 463/36 |
| 2009/0209358 A1 | 8/2009 | Niegowski |
| 2009/0233735 A1 | 9/2009 | Savarese et al. |
| 2010/0049468 A1 | 2/2010 | Papadourakis |
| 2010/0063778 A1 | 3/2010 | Schrock et al. |
| 2010/0063779 A1 | 3/2010 | Schrock et al. |
| 2010/0079830 A1 | 4/2010 | Lacoste |
| 2010/0091112 A1 * | 4/2010 | Veeser et al. .............. 348/207.1 |
| 2010/0093458 A1 | 4/2010 | Davenport et al. |
| 2010/0113174 A1 | 5/2010 | Ahern |
| 2010/0130298 A1 | 5/2010 | Dugan et al. |
| 2010/0144414 A1 | 6/2010 | Edis et al. |
| 2010/0144456 A1 * | 6/2010 | Ahern .............. 473/222 |
| 2010/0216564 A1 | 8/2010 | Stites et al. |
| 2010/0222152 A1 | 9/2010 | Jaekel et al. |
| 2010/0308105 A1 | 12/2010 | Savarese et al. |
| 2011/0015005 A1 * | 1/2011 | Pfeifer .............. 473/513 |
| 2011/0037778 A1 | 2/2011 | Deng et al. |
| 2011/0053688 A1 | 3/2011 | Crawford |
| 2011/0075341 A1 | 3/2011 | Lau et al. |
| 2011/0165998 A1 | 7/2011 | Lau et al. |
| 2011/0230273 A1 | 9/2011 | Niegowski et al. |
| 2011/0230274 A1 | 9/2011 | Lafortune et al. |
| 2011/0230985 A1 | 9/2011 | Niegowski et al. |
| 2011/0230986 A1 | 9/2011 | Lafortune et al. |
| 2012/0052972 A1 | 3/2012 | Bentley |
| 2012/0075095 A1 | 3/2012 | Howard et al. |
| 2012/0115682 A1 | 5/2012 | Homsi |
| 2012/0119098 A1 | 5/2012 | Konkle et al. |
| 2012/0120573 A1 | 5/2012 | Bentley |
| 2012/0157243 A1 | 6/2012 | Gallo |
| 2012/0277015 A1 | 11/2012 | Boyd et al. |
| 2013/0060168 A1 | 3/2013 | Chu et al. |
| 2013/0065703 A1 | 3/2013 | Rose |
| 2013/0073248 A1 | 3/2013 | Perkins et al. |
| 2013/0167290 A1 | 7/2013 | Ben Ezra |
| 2013/0203517 A1 | 8/2013 | Bolane et al. |
| 2013/0274904 A1 | 10/2013 | Coza et al. |
| 2016/0074714 A1 | 3/2016 | Krysiak et al. |

FOREIGN PATENT DOCUMENTS

| | | |
|---|---|---|
| KR | 10-1079319 | 11/2011 |
| WO | 94/27683 | 12/1994 |

OTHER PUBLICATIONS

Armour39 Module & Chest Strap, retrieved from the Internet on Jul. 12, 2013, 6 pages.

Armour39, Under Armour Guarantee, Getting Started, retrieved from the Internet on Jul. 12, 2013, 7 pages.

Gehrig et al, Visual Golf Club Tracking for Enhanced Swing Analysis, Computer Vision Lab, Lausanne, Switzerland, undated.

Grober, An Accelerometer Based Instrumentation of the Golf Club: Comparative Analysis of Golf Swings, 2009.

King, The Design and Application of Wireless Mems Inertial Measurement Units for the Measurement and Analysis of Golf Swings, 2008.

Learn how Swingbyte can improve your game, retrieved on Sep. 26, 2012 from http://www.swingbyte.com, 2 pages.

MiCoach Pacer User Manual, 31 pages.

MyCaddie, 2009, retrieved on Sep. 26, 2012 from http://www.iMakePars.com, 4 pages.

Pocketpro Golf Designs, PocketPro Full Swing Analysis in Your Pocket, www.PocketPro.org.

(56) References Cited

OTHER PUBLICATIONS

Swing it See it Fix it, Improve Gold Swing, SwingSmart Golf Analyzer, retrieved on Sep. 26, 2012 from http://www.SwingSmart.com, 2 pages.
The Nike+FuelBand User's Guide, rev 14, 26 pages.
UP by Jawbone Extended User Guide, 10 pages.
ActiveReply, "TRACE—The Most Advanced Activity Monitor for Action Sports", http://www.kickstarter.com/projects/activereplay/trace-the-most-advanced-activity-monitor-for-actio, 13 pages, Jul. 31, 2013.
Foreman et al. "A Comparative Analysis for the Measurement of Head Accelerations in Ice Hockey Helmets using Non-Accelerometer Based Systems," Nov. 19, 2012, 13 pages.
PCT International Search Report and Written Opinion dated Mar. 27, 2014, 7 pages, PCT Appl. No. PCT/US2013/072461.
International Search Report Dated Jul. 18, 2013, 6 pages, PCT Appl. No. PCT/US2013/038694.
Extended European Search Report Issued in PCT/US2012066915 on Nov. 16, 2015, 13 pages.
Supplementary Partial European Search Report Issued in PCT/U52012066915 on Jul. 31, 2015, 7 pages.
miCoach SPEED_CELL TM, User Manual, 23 pages.
Nike+iPod, User Guide, 32 pages.
SureShotGPS SS9000X, Intelligent Touch, Instruction Manual, 25 pages.
International Search Report Dated Mar. 29, 2013, 10 pages.

\* cited by examiner

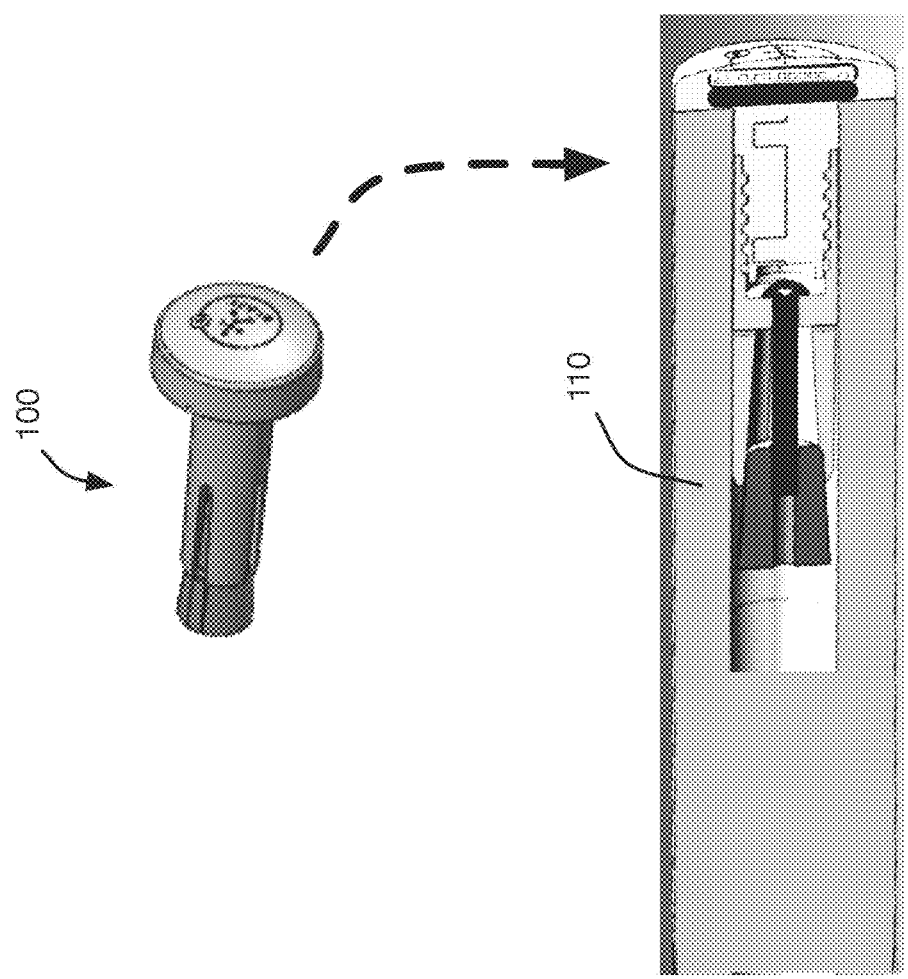

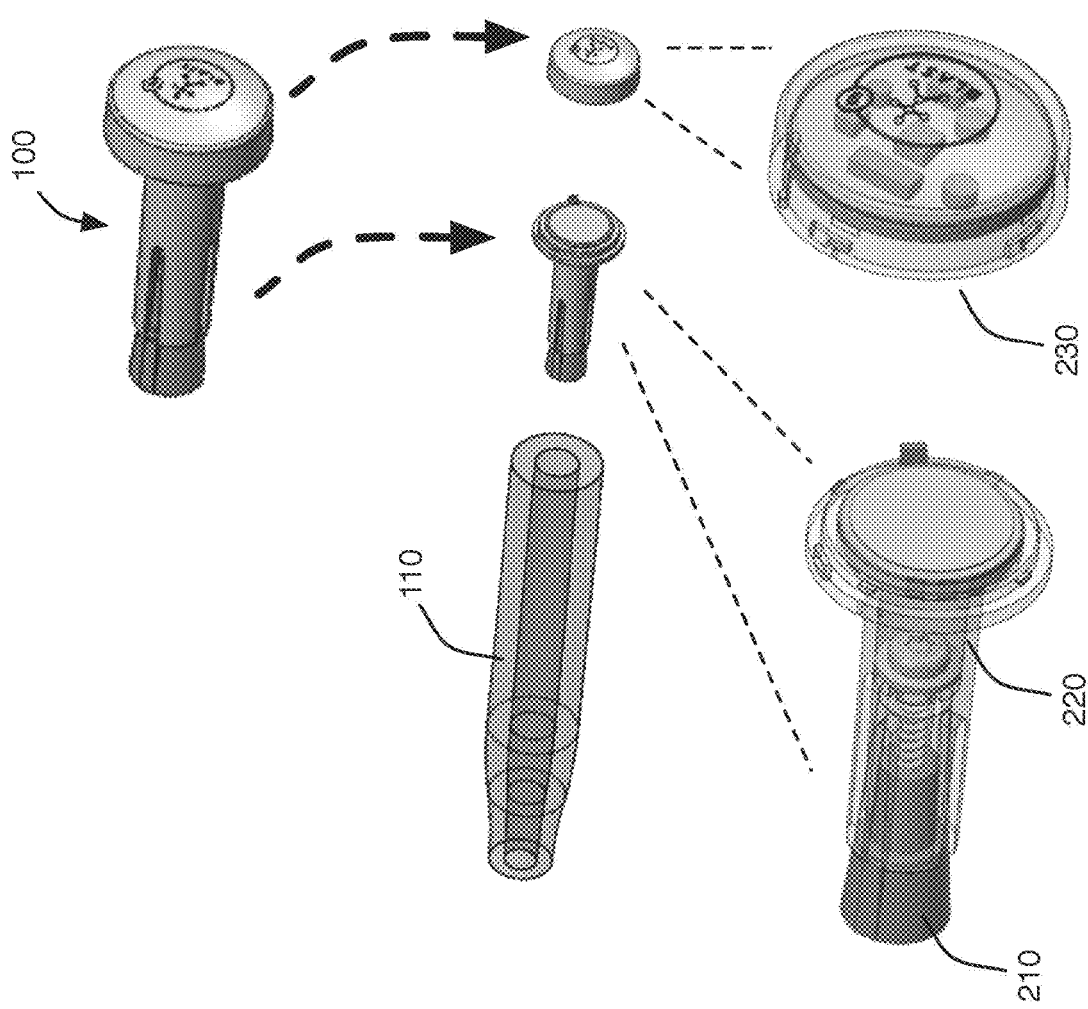

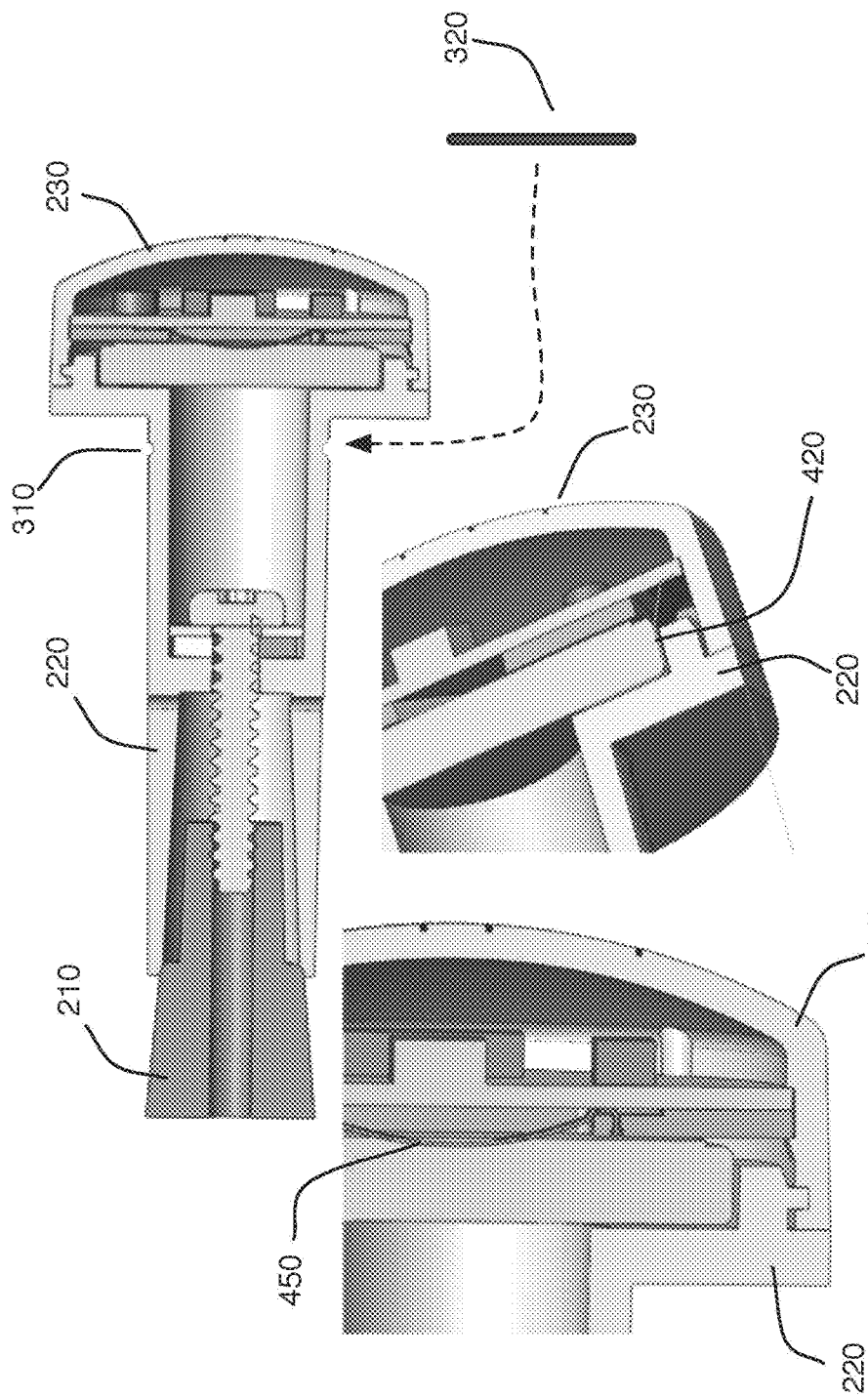

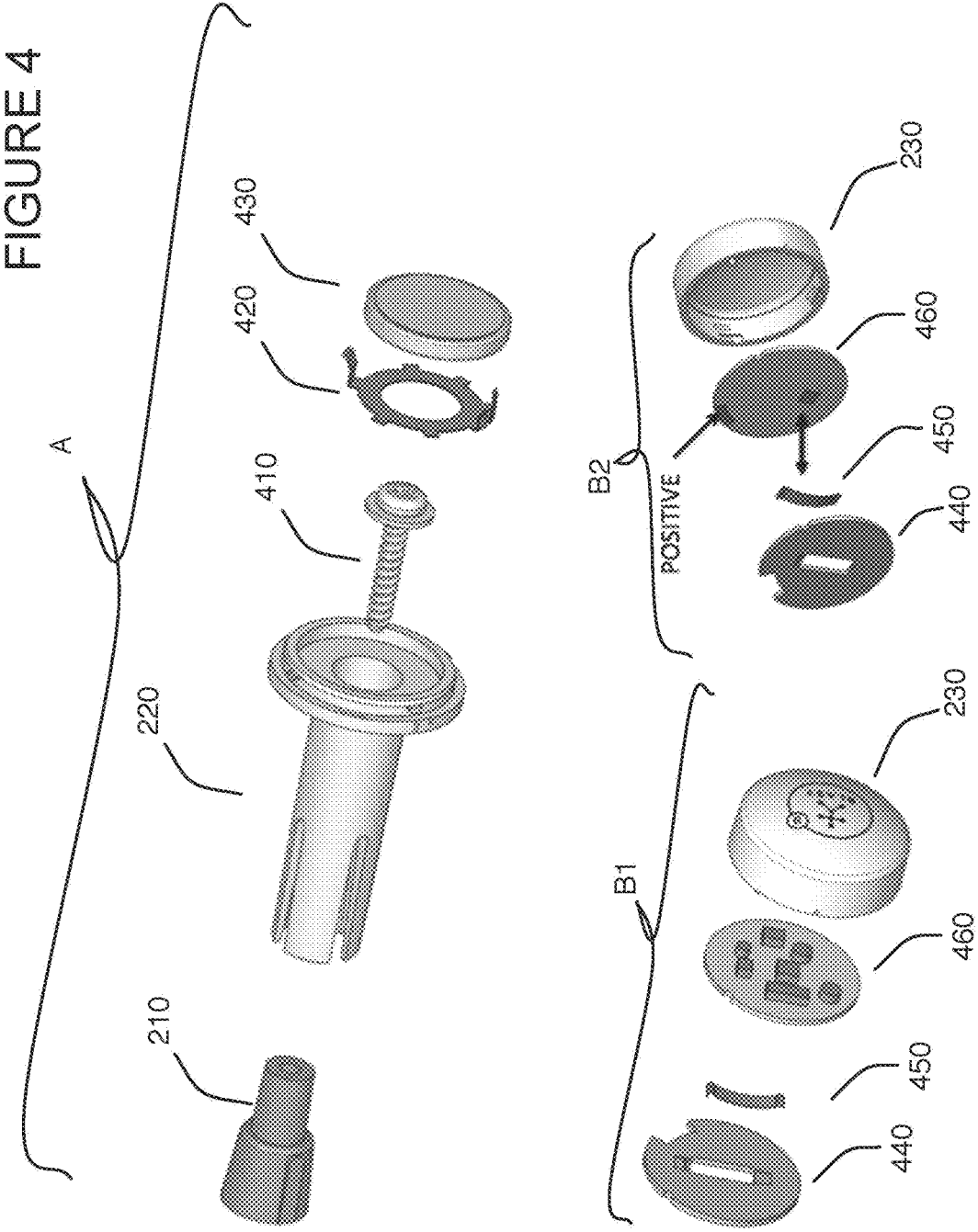

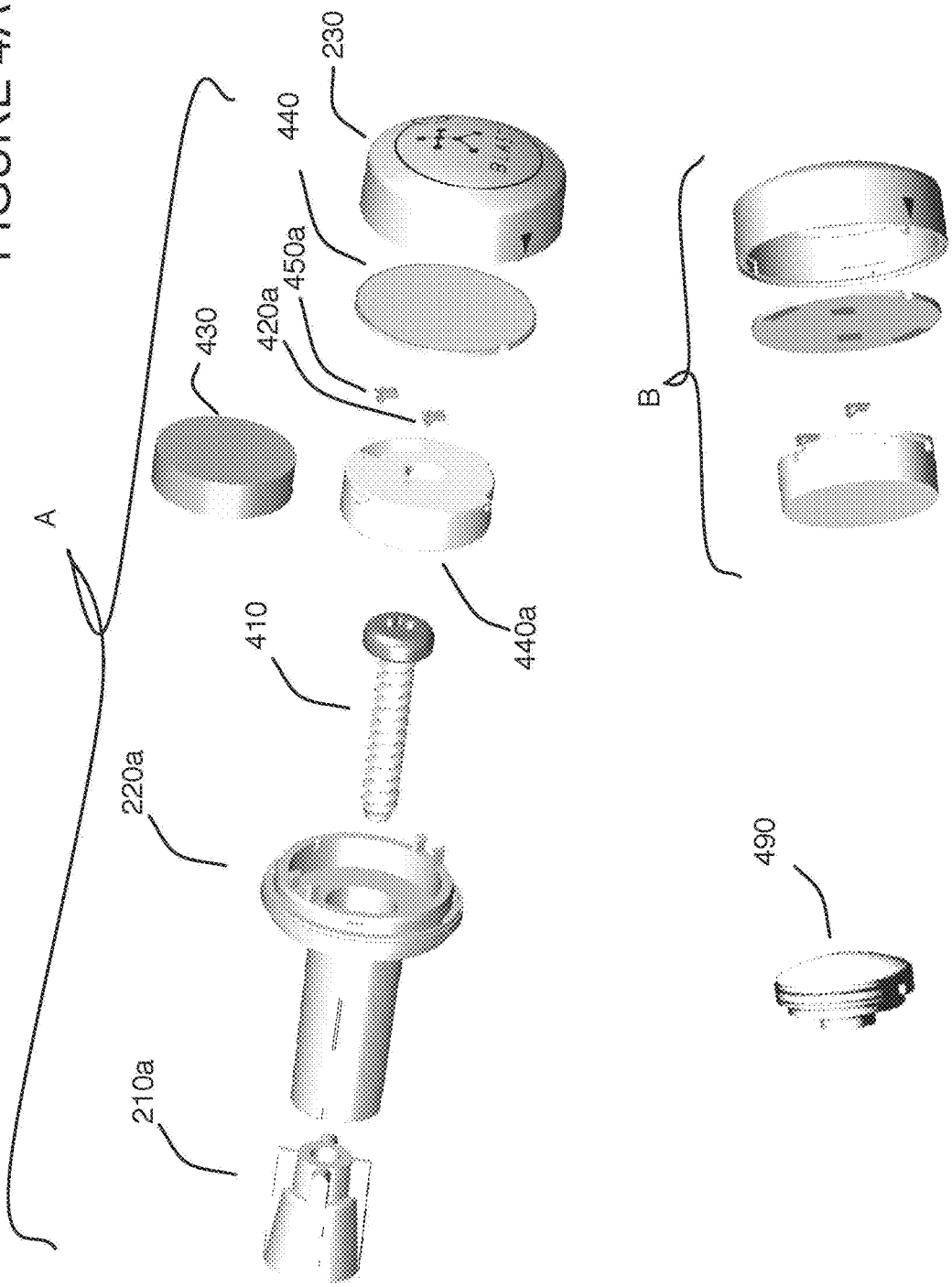

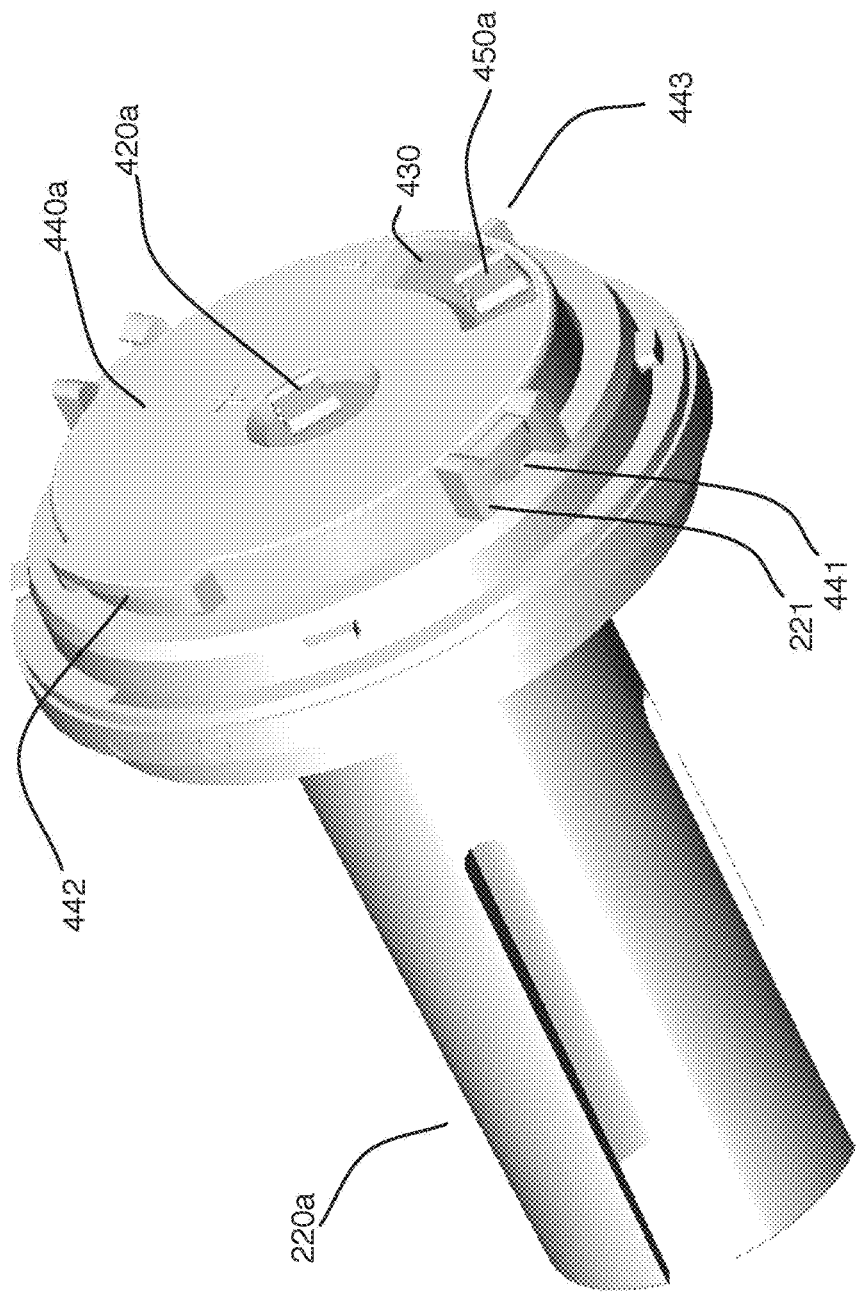

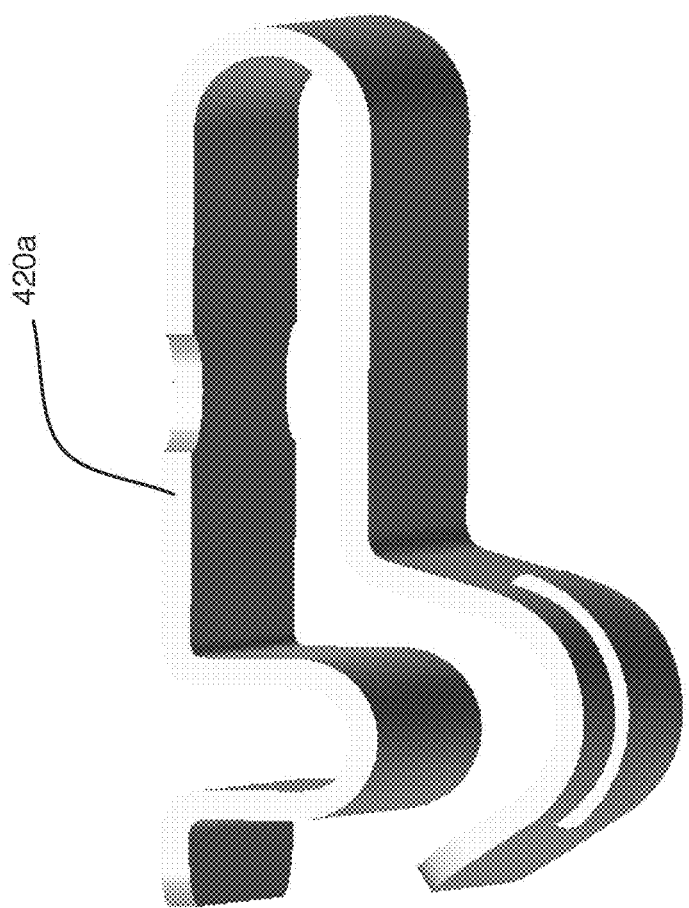

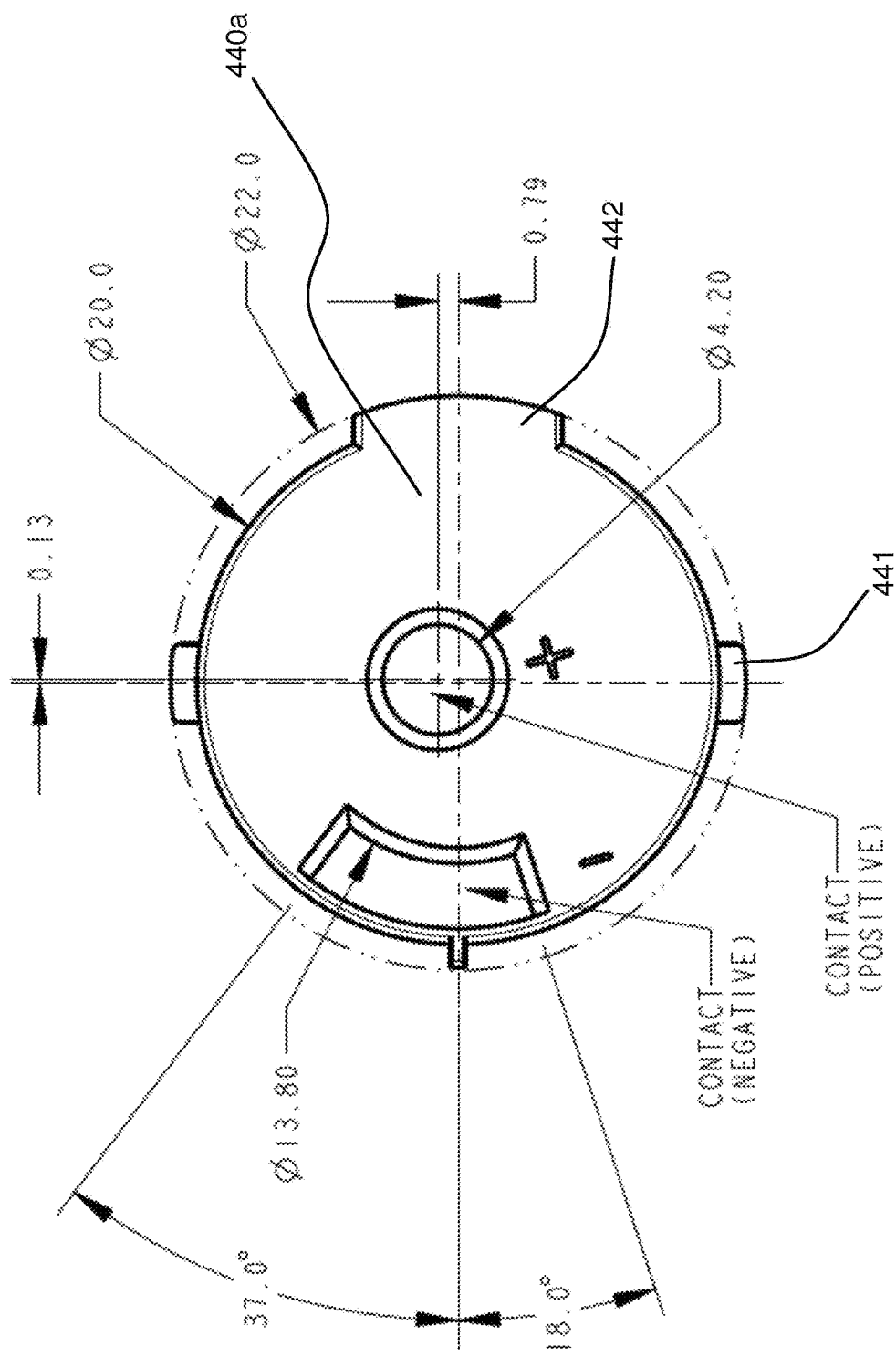

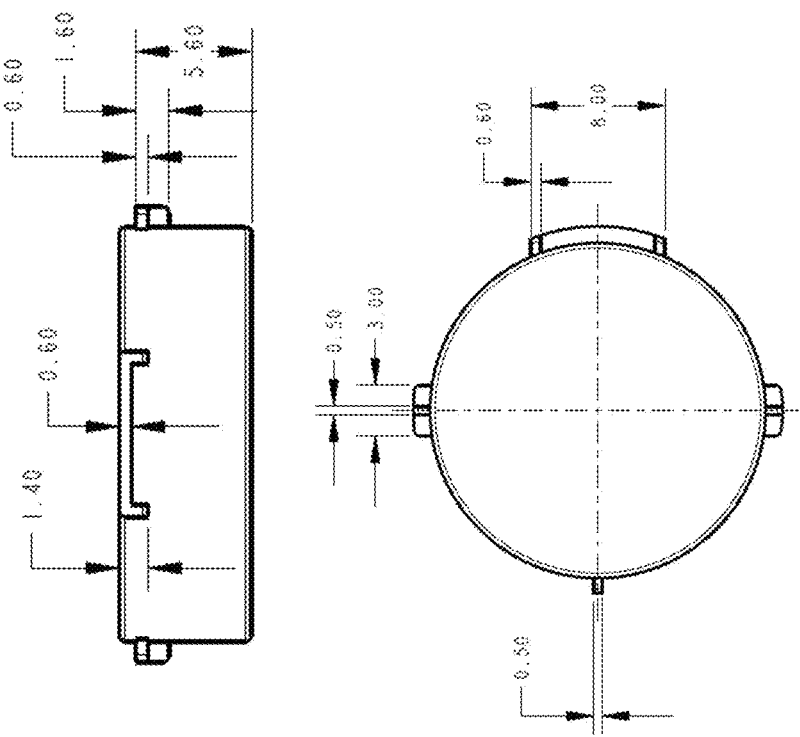
FIGURE 4G
FIGURE 4I
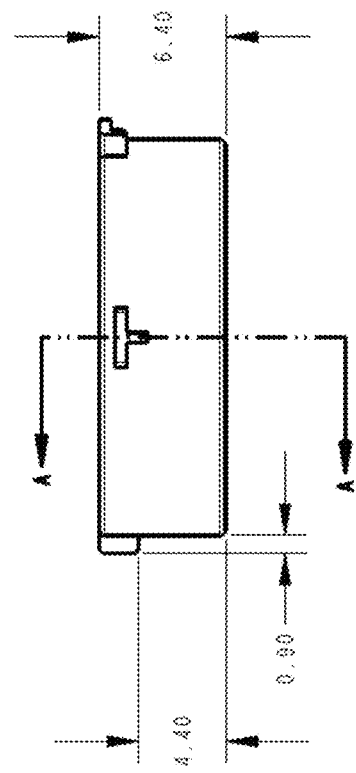
FIGURE 4F
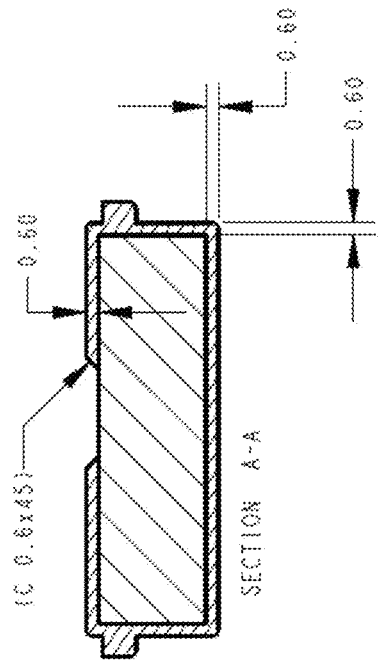
FIGURE 4H

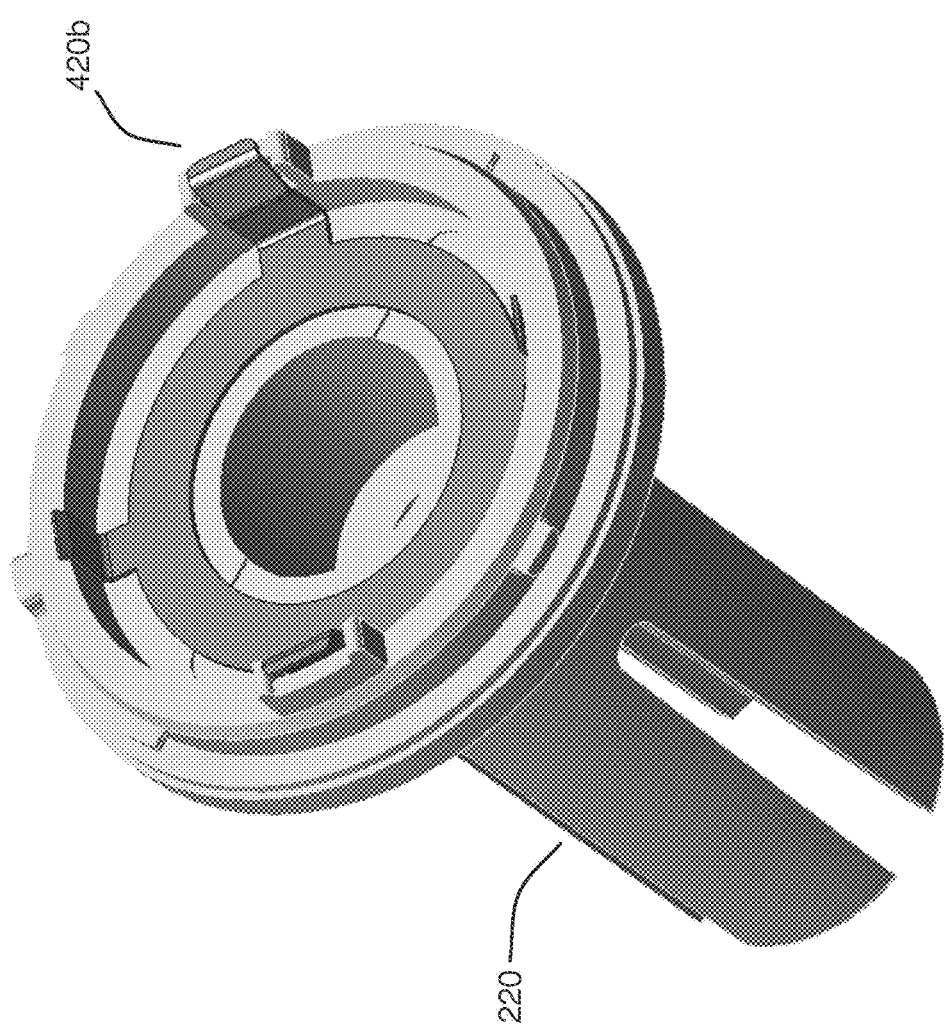

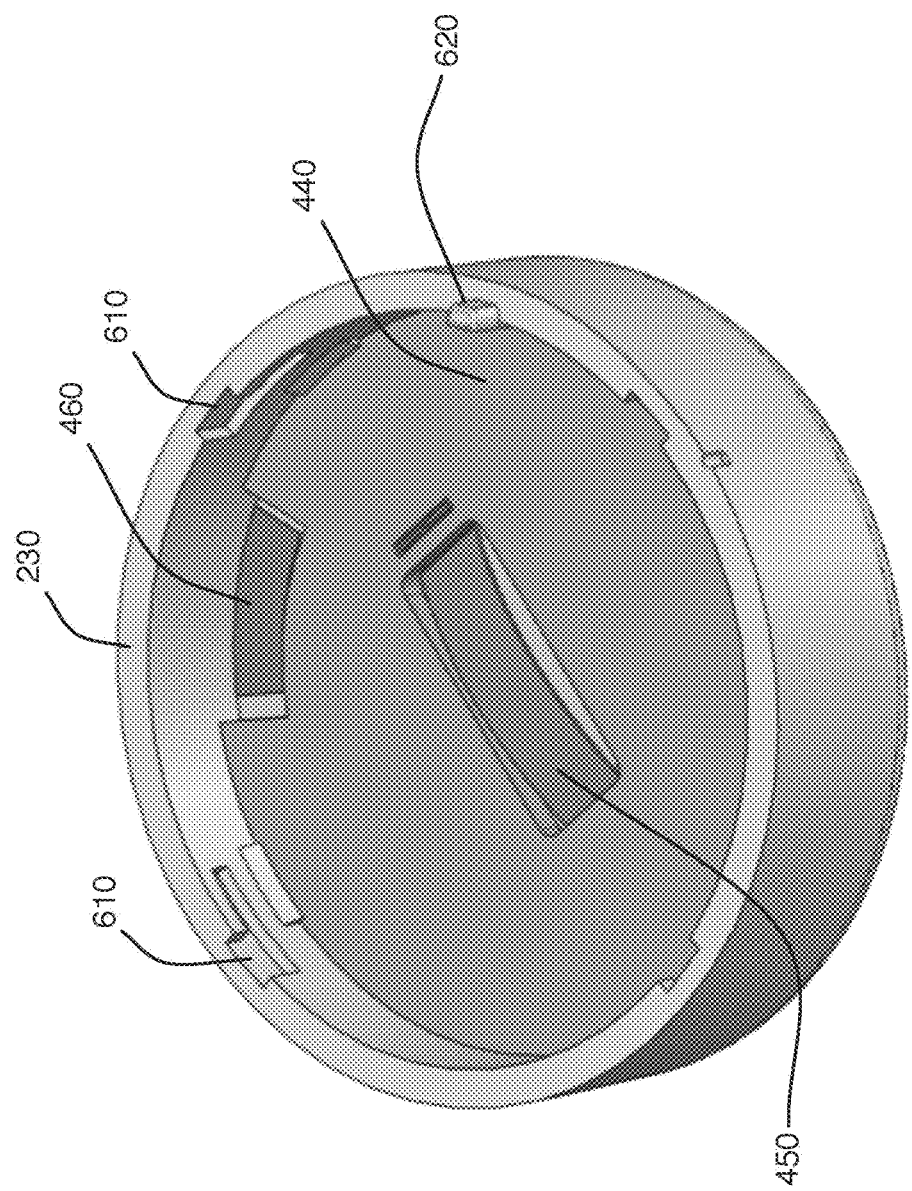

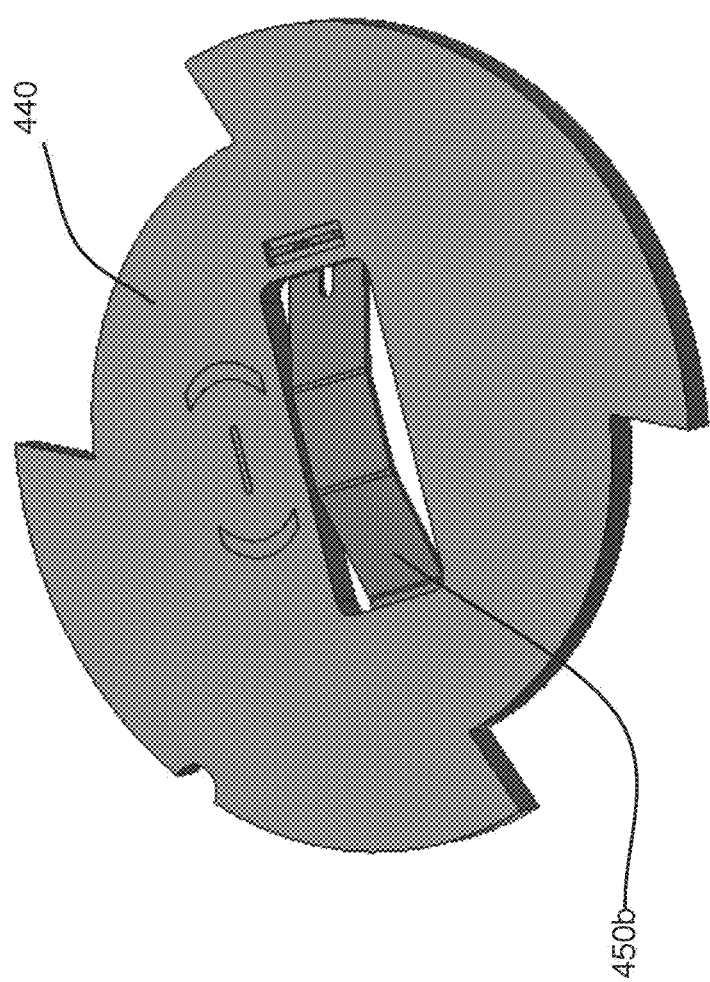

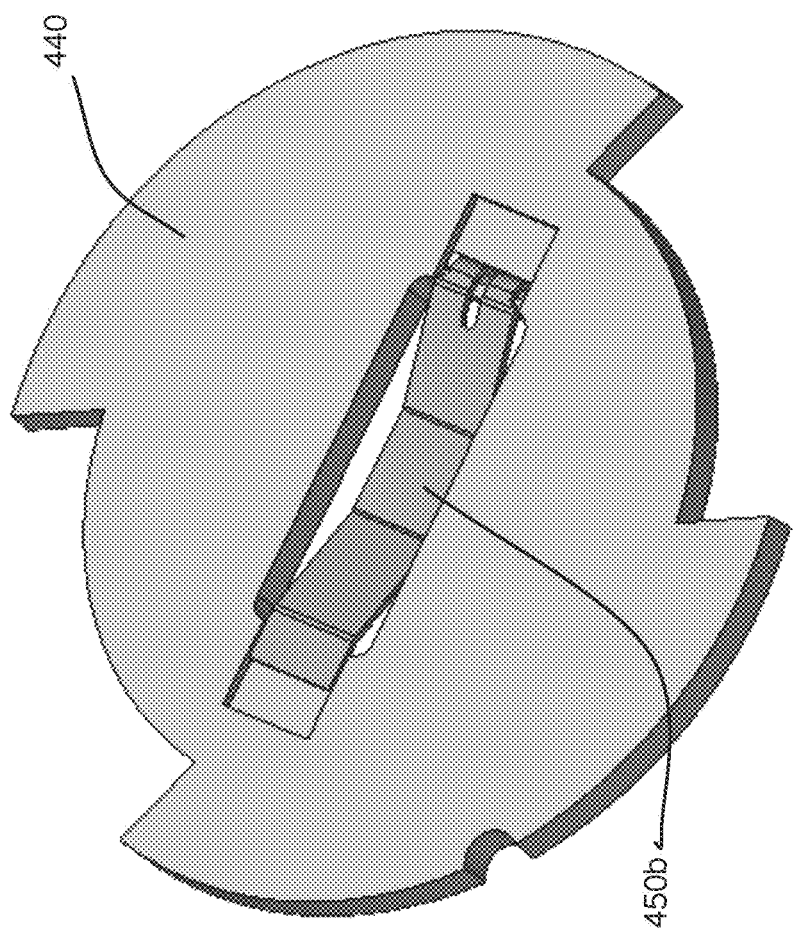

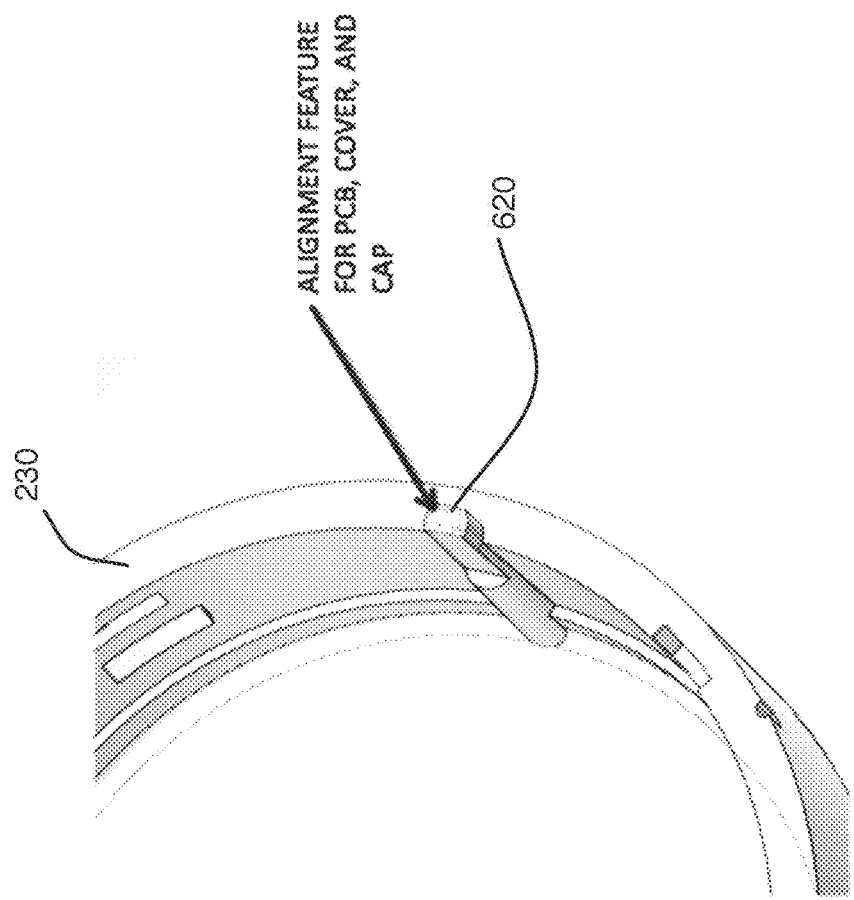

ENCLOSURE AND MOUNT FOR MOTION CAPTURE ELEMENT

This application is a continuation-in-part of U.S. Utility patent application Ser. No. 13/306,869 filed 29 Nov. 2011, which is a continuation-in-part of U.S. Utility patent application Ser. No. 13/191,309 filed 26 Jul. 2011, which is a continuation-in-part of U.S. Utility patent application Ser. No. 13/048,850 filed 15 Mar. 2011, which is a continuation-in-part of U.S. Utility patent application Ser. No. 12/901,806 filed 11 Oct. 2010, which is a continuation-in-part of U.S. Utility patent application Ser. No. 12/868,882 filed 26 Aug. 2010, the specifications of which are hereby incorporated herein by reference.

BACKGROUND OF THE INVENTION

Field of the Invention

One or more embodiments setting forth the ideas described throughout this disclosure pertain to the field of mounts as utilized in sporting equipment for electronics and visual markers. More particularly, but not by way of limitation, one or more aspects of the disclosure enable a motion capture element mount.

Description of the Related Art

Known systems for mounting electronics on sporting equipment include mounts in the shafts of fishing poles, and golf clubs for example. Existing mounts have the following limitations:

- Existing mounts for sporting equipment electronics require alteration of an existing piece of sporting equipment before attaching the mount and hence electronics. For example, known mounts require modification of the shaft of the piece of equipment to include threads.
- Some mounts extend longitudinally away from the normal ending point of the shaft for a distance that is far enough to interfere with or provide a confusing point at which to grasp the club.
- Other mounts combine the electronics on the mount itself in a monolithic package that does not allow for the weight of the club to remain constant with or without electronics installed. For example, in sports with rules against instrumented sporting equipment, the weight of an instrumented piece of sporting equipment differs from the weight of the same non-instrumented piece of sporting equipment that complies with competition rules.
- There are no known systems that include electronics within the shaft of a piece of sporting equipment that are also utilized to provide a visual marker for motion capture. Traditionally, mounts have been used for electronics or visual markers, but not both.

For at least the limitations described above there is a need for a motion capture element mount.

BRIEF SUMMARY OF THE INVENTION

Embodiments of the invention enable an enclosure and mount for motion capture element that enables a durable and secure coupling of the motion capture element to a piece of sporting, exercise or medical rehabilitation equipment, for example a baseball bat, hockey stick, lacrosse stick, helmet, skateboard, ski, snowboard, surfboard, golf club, tennis racquet, weight training bar, or any other equipment capable of movement. In addition, embodiments enable existing equipment that was not manufactured originally with a mount for electronics to be retrofitted with an enclosure and mount for motion capture element. The apparatus may be located internal or external to the piece of sporting equipment and may show a visual marker for use in visually obtaining motion in combination with electronically detected motion obtained with the motion capture sensor. For example, the outer portion of the enclosure may display a visual marker on the outer portion while the inner portion of the enclosure may be located on or within a shaft or grip in the handle portion of the equipment for example. In one or more embodiments, the grip may extend beyond the shaft and couple or aid in the coupling of the motion capture element with the shaft. One or more embodiments of the grip may include a grip that may roll down from the sides of a motion capture element to enable the motion capture element to be accessed without removing the grip from the shaft. The mount is configured to hold the enclosure to the piece of equipment wherein the enclosure holds the electronics and/or a visual marker. Embodiments of the invention do not require modifying the equipment, for example the baseball bat, tennis racquet, golf club, or other stick based equipment to include threads within the shaft. The apparatus may be flush mounted with the normal end of the equipment or have any desired length of extension from the end of the equipment. The mount also allows for the battery to be easily removed and replaced, for example without any tools. Other embodiments may make use of micro harvesting of energy to recharge batteries internal to the enclosure.

One or more embodiments of the mount include a shaft enclosure and expander that may be coupled with an attachment element, for example a screw that is aligned along an axis parallel to the axis of the shaft of the handle-based piece of equipment. The shaft enclosure and expander are situated within the handle portion of a handle-based piece of equipment such as a baseball bat, hockey stick, lacrosse stick, or golf club and engage in inner portion of the shaft or grip for example. In one or more embodiments, the screw is then rotated to move the shaft enclosure and expander together, which thus forces legs of the shaft enclosure in a direction orthogonal to the axis of the shaft. The force of the shaft enclosure against the inner wall of the shaft thus couples the shaft enclosure to the shaft non-permanently, for example based on the coefficient of static friction therebetween. After the shaft enclosure and expander are brought close enough together via the attachment element to securely couple the mount to the shaft or inside portion of a grip that is coupled to the shaft, then either the electronics package or a weight element is coupled with the shaft enclosure. In one or more embodiments, the weight element may weigh the same or approximately the same as the motion capture element so that there is no difference in weight to the piece of equipment with or without the motion capture element. In addition, certain sports may not allow the piece of equipment to be instrumented during match play. Embodiments of the weight element require no modification of the equipment. A cap is coupled with the shaft enclosure in either case, which provides a cover for the weight element or electronics package and which may include a visual marker and/or logo on the cap. Any other method or structure that enables a non-permanent mount of the apparatus that requires no modification of the shaft is in keeping with the spirit of the invention. Other embodiments may make use of a spear collet that enables coupling of a motion capture sensor with this type of mount to a stick or handle-based piece of equipment having a small hole in the end of the rubber grip on the handle. Other embodiments may utilize a shock puck that surrounds the enclosure and absorbs sudden shocks to the motion capture sensor within the enclosure, or otherwise dampens vibrations from the piece of equipment. Other embodiments may couple with helmets to obtain concussion related acceleration data, or obtain motion data related to board based sports such as snowboards, surfboards, skateboards as well as skis.

If the electronics package is installed, then generally a positive battery contact, printed circuit board (PCB), an insulator or insulative spacer, with negative electrical contact and battery may be installed between the shaft enclosure and cap. The electronics that may be coupled with the PCB for example may include active motion capture electronics that are battery powered, passive or active shot count components, for example a passive or active radio frequency identification (RFID) tag. Embodiments of the electronics may include motion capture accelerometers and/or gyroscopes and/or an inertial measurement unit along with wireless transmitter/receiver or transceiver components. The RFID tag enables identification of the specific piece of equipment, for example to determine which piece of equipment specific motion capture data is associated with. Identification information for example enables golf shots for each club associated with a golfer to be counted. Golf shots may optionally be counted via an identifier associated with motion capture electronics on the golf club in conjunction with a mobile computer, for example an IPHONE® equipped with an RFID reader that concentrates the processing for golf shot counting on the mobile computer instead of on each golf club. Optionally a wireless antenna may be coupled with the cap or alternatively may be implemented integral to the PCB as desired. In one or more embodiments, the antenna may be implemented as a Bluetooth® antenna embedded in an external portion of the enclosure, for example embedded in epoxy on an outer portion of the enclosure to maximize antenna coverage. One or more embodiments of the invention may also include a Global Positioning System (GPS) antenna. The GPS antenna may be mounted on the printed circuit board or may be located separate from the printed circuit board. One or more embodiments of the invention may also directly or indirectly communicate with any other sensors coupled with the club including motion analysis capture elements, strain gauges or any other type of sensor coupled for example with the golf club head. One or more embodiments of the invention may also utilize a battery coupling that attaches the battery to the shaft enclosure so that when the cap is removed, the battery does not fall out, unless intended. Embodiments may also utilized spring based electrical contacts to prevent loss of electrical conductivity under high acceleration.

As previously stated, one or more embodiments may include a weight element that is interchangeable with the electronic package in the mount. The electronics package may be removed for example to comply with any sporting rules that do not allow instrumented sporting equipment. For example, USGA Rule 14-3 on Artificial Devices prohibits any "unusual device", for example under 14-3(b) "For the purpose of gauging or measuring distance". Any embodiment of the electronics package including a GPS receiver may thus be removed prior to match play for example and replaced with a weight element to minimize the weight difference. For example, the weight element may for example weigh close to or the same as the electronics to minimize overall instrumented versus non-instrumented weight differences of the golf club. In addition, a manufacture may provide the mount on each club with a small weight for example, that is removed when the golfer decides to upgrade the club to include active instrumented electronics or passive shot count elements that weigh the same amount.

The net effect on the club dynamics for swing then is negligible. In one embodiment, the plastic portion of the mount weighs 5.7 grams and the battery weighs 3 grams while the screw weighs 1.9 grams. Thus the mounting components have minimal weight and by selecting a weight element of the same weight of the electronics package, or elements within the shaft enclosure and cap that are replaced by the weight element, the golfer feels no change in club weight when upgrading to an instrumented club. The same weight element may be utilized with respect to embodiments of the invention in all other sports and pieces of equipment used in those sports, as one skilled in the art will appreciate.

The visual marker may be mounted on the cap for use with visual motion capture cameras. An equipment number may also be displayed on in a display area of the cap to indicate which type or specific piece of equipment is associated with the motion capture sensor, e.g., a club number is associated with the golf club. Embodiments of the visual marker may be passive or active, meaning that they may either have a visual portion that is visually trackable or may include a light emitting element such as a light emitting diode (LED) that allows for image tracking in low light conditions respectively. This for example may be implemented with a graphical symbol or colored marker at the cap of the mount on the shaft at the end of the handle for example. Motion analysis may be performed externally, for example using a camera and computer system based on the visual marker in any captured images. The visual data may also be utilized in motion analysis in combination with any wireless data from any installed electronics package.

BRIEF DESCRIPTION OF THE DRAWINGS

The above and other aspects, features and advantages of the ideas conveyed through this disclosure will be more apparent from the following more particular description thereof, presented in conjunction with the following drawings wherein:

FIG. 1 illustrates an embodiment of the invention alone in perspective view and as mounted in a shaft of a handle-based piece of equipment as shown in cutaway view.

FIG. 2 illustrates an embodiment of the invention broken into an exploded view of the main components along with the shaft handle and blow up views of the major components in transparent shading.

FIG. 3A illustrates a detailed cutaway view of the main components of an embodiment of the invention.

FIG. 3B illustrates a detailed cutaway view showing the negative battery contact, also shown in full in exploded view in FIG. 4.

FIG. 3C illustrates a detailed cutaway view showing the positive battery contact, also shown in full in exploded view in FIG. 4.

FIG. 4 illustrates an exploded view "A" of the main mount components along with the positive battery contact and battery, while view "B1" shows a top oriented view of the insulator, negative battery contact, electronics package, here a printed circuit board or PCB and cap, while view "B2" shows a bottom oriented view of the same components shown in view "B1".

FIG. 4A illustrates an exploded view "A" of the main mount components of a second embodiment of the invention along with the positive and negative battery contact and battery, while view "B" shows a bottom oriented view of the insulator, positive and negative battery contact, electronics package, here a printed circuit board or PCB and cap.

FIG. 4B illustrates a perspective view of the shaft enclosure and insulator of a second embodiment of the invention along with the positive and negative battery contact and battery.

FIG. 4D illustrates a perspective close-up view of the positive battery contact.

FIG. 4E illustrates a top view of an embodiment of the insulator that is configured to house a battery along with specific exemplary dimensions.

FIG. 4F illustrates a first side of the embodiment of the insulator of FIG. 4E.

FIG. 4G illustrates a second side of the embodiment of the insulator of FIG. 4E.

FIG. 4H illustrates a cross section view "A" of FIG. 4F.

FIG. 4I illustrates a bottom view of the embodiment of the insulator of FIG. 4E.

FIG. 5A illustrates a second embodiment of the positive battery contact located in the shaft enclosure.

FIG. 6 illustrates a close up perspective view of the cap with PCB and negative battery contact showing along with a coupling element, here four coupling points, and alignment element.

FIG. 6A illustrates a second embodiment of the negative batter contact having faceted surfaces as shown from the bottom side of the insulator.

FIG. 6B illustrates the embodiment of FIG. 6A as shown from the top side of the insulator.

FIG. 7 illustrates a close up perspective view of the cap and alignment element.

DETAILED DESCRIPTION OF THE INVENTION

Figure 4C:
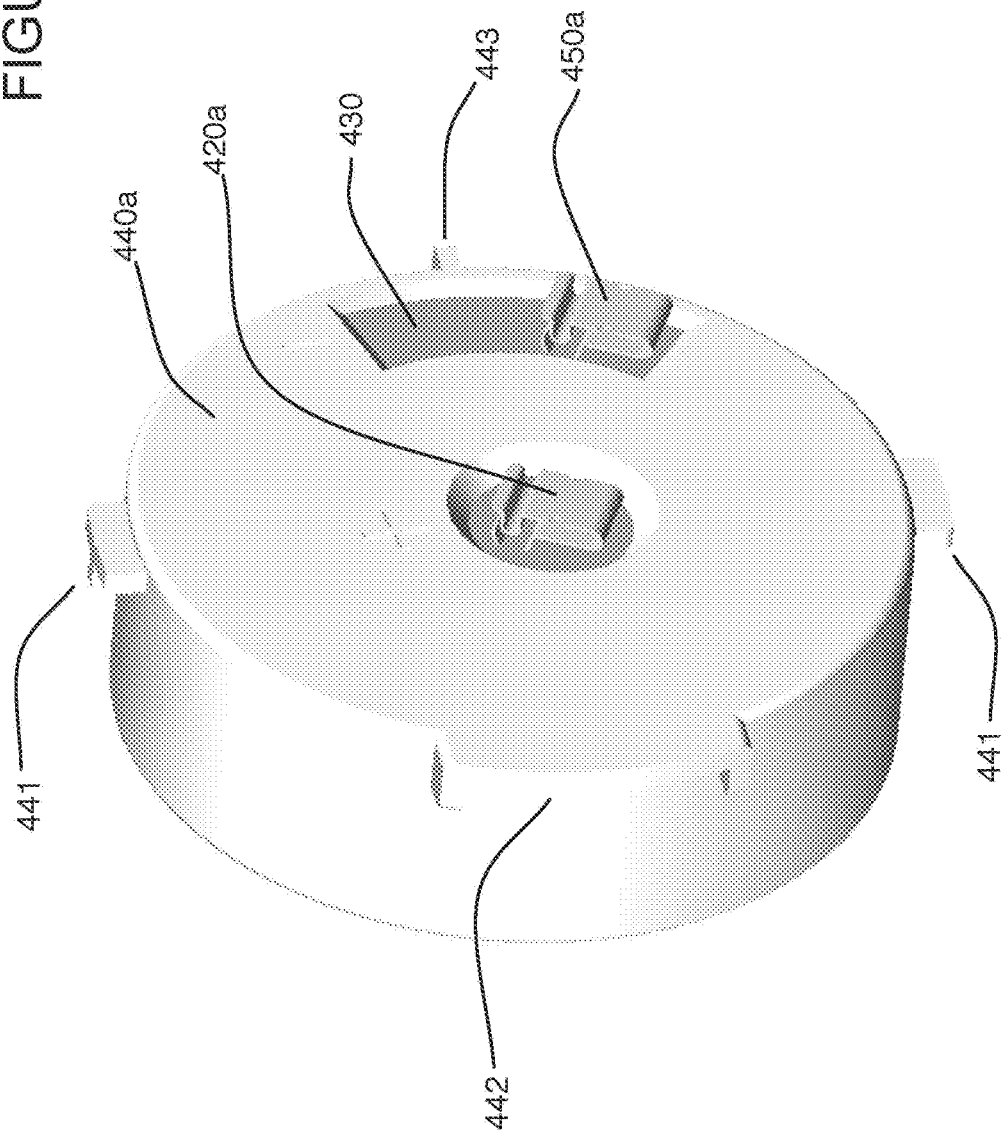
FIG. 4C illustrates a perspective view of the insulator along with the positive and negative battery contact and battery.

An enclosure and mount for motion capture element will now be described. In the following exemplary description numerous specific details are set forth in order to provide a more thorough understanding of the ideas described throughout this specification. It will be apparent, however, to an artisan of ordinary skill that embodiments of ideas described herein may be practiced without incorporating all aspects of the specific details described herein. In other instances, specific aspects well known to those of ordinary skill in the art have not been described in detail so as not to obscure the disclosure. Readers should note that although examples of the innovative concepts are set forth throughout this disclosure, the claims, and the full scope of any equivalents, are what define the invention. One skilled in the art will recognize that embodiments of the invention may be utilized in any equipment capable of coupling with the apparatus. This includes any piece of sporting, exercise or medical rehabilitation equipment, for example a baseball bat, hockey stick, lacrosse stick, helmet, skateboard, ski, snowboard, surfboard, golf club, tennis racquet, weight training bar, or any other equipment capable of movement. The apparatus may be located internal or external to the piece of sporting equipment and may show a visual marker for use in visually obtaining motion in combination with electronically detected motion obtained with the motion capture sensor. For example, the outer portion of the enclosure may display a visual marker on the outer portion while the inner portion of the enclosure may be located on or within a shaft or grip in the handle portion of the equipment for example.

FIG. 1 illustrates an embodiment of the invention 100 alone in perspective view and as mounted in a shaft of a piece of movement equipment, for example a baseball bat, hockey stick, lacrosse stick, golf club, tennis racquet or any piece of equipment having a handle near shaft 110 as shown in cutaway view. Embodiments enable a mount for a new piece of equipment or that can be retrofitted in an existing piece of equipment. The mount may be located in the handle portion of the shaft, or for example within a grip that is to be attached to the shaft, and is configured to hold electronics and/or a visual marker.

FIG. 2 illustrates an embodiment of the invention broken into an exploded view of the main components along with the shaft handle and blow up views of the major components in transparent shading. One or more embodiments of the mount include enclosure or shaft enclosure 220 and expander 210 that may be coupled with an attachment mechanism, for example a screw aligned along an axis parallel to the axis of the shaft. The shaft enclosure and expander are situated within the handle, i.e., shaft 110. In one or more embodiments, the screw is then rotated to move the shaft enclosure towards the expander, which thus forces legs of the shaft enclosure in a direction orthogonal to the axis of the shaft. The force of the shaft enclosure against the inner wall of the shaft thus couples the shaft enclosure to the shaft based on the coefficient of static friction therebetween. Any other mechanism of coupling the shaft enclosure to a shaft in a non-permanent manner is in keeping with the spirit of the invention. After the shaft enclosure and expander are brought close enough together via the screw to securely couple the mount to the shaft, then either the electronics package or a weight element that may for example weigh the same as the electronics, is coupled with the shaft enclosure. Cap 230 is coupled with the shaft enclosure in either case, which provides a cover for the weight element or electronics package and which may include a visual marker and/or logo on the cap. One or more embodiments of the electronics package are removable to comply with any sporting rules that do not allow instrumented sporting equipment for example. Any other method or structure that enables a non-permanent mount of the apparatus that requires no modification of the shaft is in keeping with the spirit of the invention.

Optionally, an identification element or ID sticker, for example an RFID tag may be mounted within the enclosure, cap, or any other portion of the apparatus, for equipment identification, or shot count functionality. The identification element may also be implemented integral to, or coupled with the PCB in any manner as desired.

If the electronics package is installed, then generally a positive battery contact, printed circuit board or PCB, an insulator or insulative spacer, with negative electrical contact and battery may be installed between the shaft enclosure and cap. Optionally, a wireless antenna and/or GPS antenna may be coupled with the cap or alternatively may be implemented integral to the PCB as desired. Also see FIGS. 3A-C, 4, 4A-D and 9 for more detailed views.

FIG. 3A illustrates a detailed cutaway view of the main components of an embodiment of the invention, specifically expander 210, shaft enclosure 220 and cap 230. FIG. 3B illustrates a detailed cutaway view showing negative battery contact 450, also shown in full in exploded view in FIG. 4. FIG. 3C illustrates a detailed cutaway view showing positive battery contact 420, also shown in full in exploded view in FIG. 4. Optional O-ring indentation 310 on shaft enclosure 220 provides a potential well for O-ring 320 to be located. Different size O-rings may be utilized to provide a secure fit on the end of shaft enclosure 220 on the end near cap 230.

FIG. 4 illustrates an exploded view "A" of the main mount components, namely expander 210, shaft enclosure 220 along with screw 410, positive battery contact 420 and battery 430, while view "B1" shows a top oriented view of the insulator 440, negative battery contact 450, electronics package 460, here a printed circuit board or PCB and cap 230, while view "B2" shows a bottom oriented view of the same components shown in view "B1". The left portion of shaft enclosure 220 shows extensions or "legs" that allow for the shaft enclosure to radially expand when expander 210 is pulled along the axis shown by screw 410, when screw 410 is rotated. To keep expander 210 from simply rotating when screw 410 is rotated, expander 210 may include a protrusion (shown on the left side of the expander) that aligns in a slot formed by two of the shaft enclosure's legs. In this manner, expander 210 is pulled along the axis of the screw without rotating along that axis. Electronics package 460 for example may include active motion capture electronics that are battery powered, passive or active shot count components, for example a passive or active RFID tag, which for example may be coupled with electronics package 460 or for example coupled with insulator 440. In addition, a GPS antenna may also be coupled with electronics package 460 or cap 230 (see FIG. 9A). Embodiments of the electronics may include motion capture accelerometers and/or gyroscopes and/or an inertial measurement unit along with wireless transmitter/receiver or transceiver components. The RFID tag enables golf shots for each club associated with a golfer to be counted. The RFID tag may be coupled with any component shown as RFID tags are tiny, for example cap 230 or shaft enclosure 220 or electronics package 460, or any other element. Golf shots may optionally be counted via an identifier associated with motion capture electronics on the golf club in conjunction with a mobile computer, for example an IPHONE® equipped with an RFID reader that concentrates the processing for golf shot counting on the mobile computer instead of on each golf club.

The visual marker may be mounted on cap 230, shown as a circle with dots in view B1 may be utilized with visual motion capture cameras. An equipment number, for example a golf club number may also be displayed on in a display area of the cap to indicate which club number is associated with the golf club, which is shown as a small circle with a number in it in view B1. Embodiments of the visual marker may be passive or active, meaning that they may either have a visual portion that is visually trackable or may include a light emitting element such as a light emitting diode (LED) that allows for image tracking in low light conditions respectively. This for example may be implemented with a graphical symbol or colored marker at the cap of the mount on the shaft at the end of the handle for example. Motion analysis may be performed externally, for example using a camera and computer system based on the visual marker in any captured images. The visual data may also be utilized in motion analysis in combination with any wireless data from electronics package 460.

FIG. 4A illustrates an exploded view "A" of the main mount components of a second embodiment of the invention, namely expander 210a, with ribs slightly offset with respect to expander 210 of FIG. 4. In addition, FIG. 4A also shows a second embodiment of shaft enclosure 220a having coupling elements that enable second embodiment of insulator 440a to securely couple to shaft enclosure 220a without falling out if the mount is turned upside down for example. In this embodiment, insulator 440a holds battery 430 inside while providing access to the battery so that positive battery contact 420a and negative battery contact 450a can make electrical contact with battery 430. View "B" shows a bottom-oriented view of the insulator, positive and negative battery contact, electronics package, here a printed circuit board or PCB and cap. Weight element 490 can be any shape so long as weight element 490 fits within, or couples in any direct or indirect manner with shaft enclosure 220 or 220a and cap 230 for example. Weight element 490 can be made to weigh as near as desired to the weight of the components that it replaces, for example to comply with any sporting rules that do not allow instrumented sporting equipment, e.g., during competition. Weight element 490 can also be utilized with the embodiment shown in FIG. 4 as one skilled in the art will appreciate.

FIG. 4B illustrates a perspective view of shaft enclosure 220a and insulator 440a of the second embodiment of the invention of FIG. 4A along with the positive and negative battery contact 420a and 450a respectively (situated above holes in insulator 440a) along with battery 430 that is internally held within insulator 440a. Insulator 440a includes for example snap components, e.g., coupling elements 441 that couple with coupling elements 221 of shaft enclosure 220a so that insulator 440a and hence battery 430 do not fall out when the cap is removed. To remove insulator 440a and hence battery 430, tab 442 may be engaged with for example a finger, screw driver or other implement to disengage coupling elements 441 from coupling elements 221. Alignment component 443 enables rotational alignment of the insulator with the shaft enclosure.

FIG. 4C illustrates a perspective view of the insulator along with the positive and negative battery contact 420a and 450a respectively, and battery 430. Coupling elements 441 are shown on the top and bottom in the written page, however any type of coupling element may be utilized in keeping with the spirit of the invention as desired.

FIG. 4D illustrates a perspective close-up view of positive battery contact 420a. In one or more embodiments of the invention, the positive and negative battery contacts may utilize the same structure. Any type of positive and negative battery contacts may be utilized so long as they maintain electric connection between the battery and electronics package.

FIG. 4E illustrates a top view of an embodiment of insulator 440a that is configured to house a battery along with specific exemplary dimensions. To remove insulator 440a and hence the battery within insulator 440a, tab 442 may be engaged with for example a finger, screw driver or other implement to disengage coupling elements 441 from the coupling elements shown for example in FIG. 4B. In this figure, the numbers represent millimeters, and angle tolerances are within 2 degrees. As shown, this embodiment of insulator 440a is configured to house a 6.4 mm battery. Although not required for distribution in some countries, one or more embodiments of insulator 440a may be constructed to be compliant with EU Directive 2002/95/EC (RoHS) and EU Directive 2002/96/EC (WEEE). Embodiments may alternatively be constructed to be compliant with any other electrical or manufacturing standards as desired.

FIG. 4F illustrates a first side of the embodiment of the insulator of FIG. 4E. See also FIG. 4H for the cross section view. FIG. 4G illustrates a second side of the embodiment of the insulator of FIG. 4E. FIG. 4H illustrates a cross section view "A" of FIG. 4F. FIG. 4I illustrates a bottom view of the embodiment of the insulator of FIG. 4E.

Figure 5:
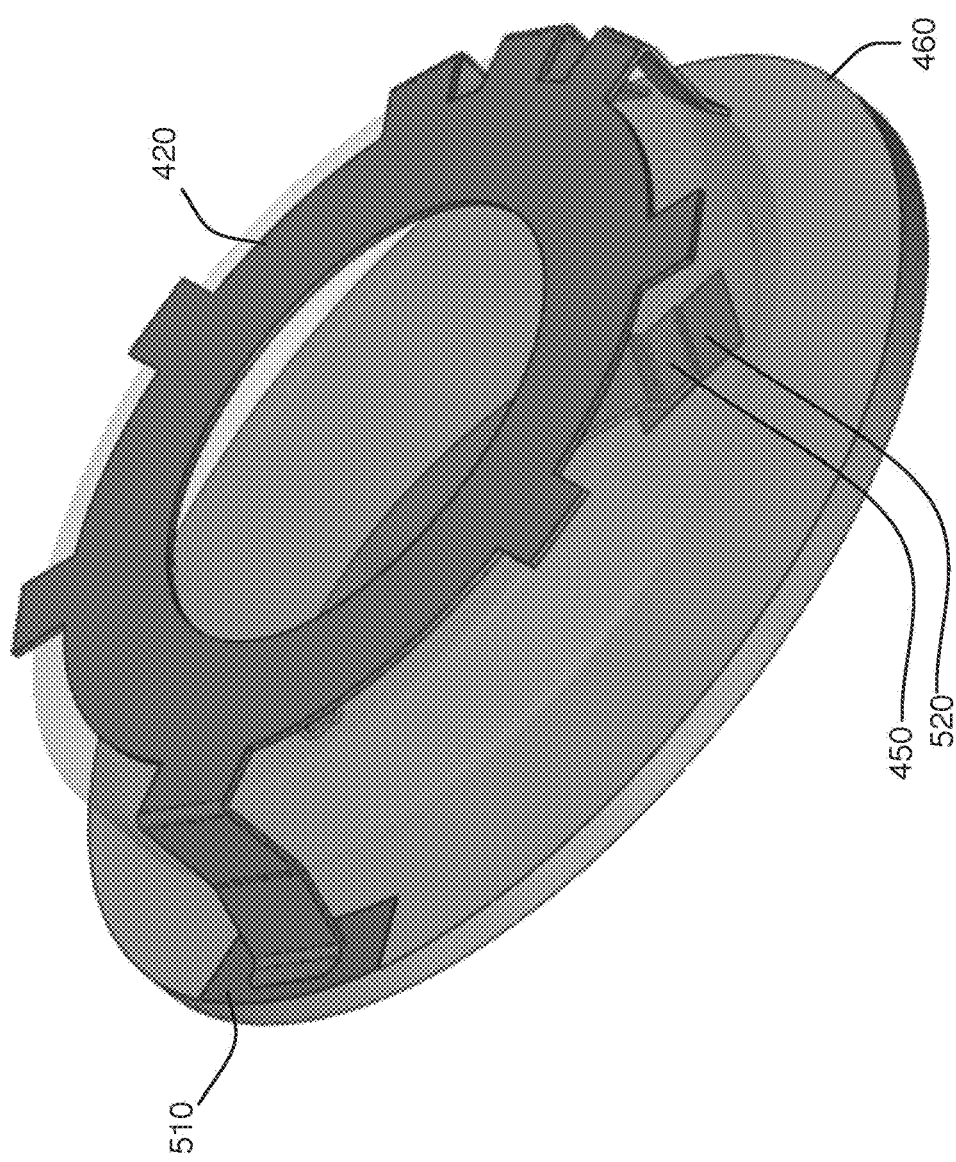
FIG. 5 illustrates a close up perspective view of the PCB and associated positive and negative contacts that are configured to make an electrical connection with the positive battery contact and the negative battery contact respectively.

FIG. 5 illustrates a close up perspective view of the electronics package 460 or PCB and associated positive contact 510 and negative contact 520 that are configured to make an electrical connection with the positive battery contact 420 and the negative battery contact 450 respectively. See also FIG. 4 for an exploded view of the relative positioning of the components shown in this figure.

FIG. 5A illustrates a second embodiment of positive battery contact 420b located in the shaft enclosure. This embodiment is symmetrical in that there are two opposing sets of upward projections from the base plane that contacts shaft enclosure 220. One of the opposing sets of upward projections of positive battery contact 420b are slightly wider and are positioned within areas on shaft enclosure 220 to allow for radially aligning positive battery contact 420b with respect to shaft enclosure 220.

FIG. 6 illustrates a close up perspective view of cap 230 with electronics package 460 or PCB and negative battery contact 450 coupled with insulator 440 showing along with a coupling element, here four coupling points 610 (with only the top two shown with reference number 610 with the inside portions visible, while the opposing two have only the initial slot openings in the cap visible), and alignment element 620.

FIG. 6A illustrates a second embodiment of the negative battery contact 450b having faceted surfaces as shown from the bottom side of insulator 440. FIG. 6B illustrates the embodiment of FIG. 6A as shown from the top side of the insulator. The right portion of negative battery contact 450b as shown may be folded over to engage insulator 440 while the opposing end of negative battery contact 450b may freely travel in a slot provided in insulator 440. The slot allows for the negative battery contact 450b to flatten, and hence travel in the slot, based on the force generated by placing the battery against negative battery contact 450b.

FIG. 7 illustrates a close up perspective view of the cap and alignment element. Alignment element 620 allows for the angular alignment of insulator 440, and electronics package 460 that have indents on their sides to engage the alignment element 620. (See FIG. 4). By aligning insulator 440 and electronics package 460 with cap 230, positive battery contact 420 and negative electrical contact 450 are also aligned rotationally since they couple to respective components non-rotationally, for example.

Figure 8:
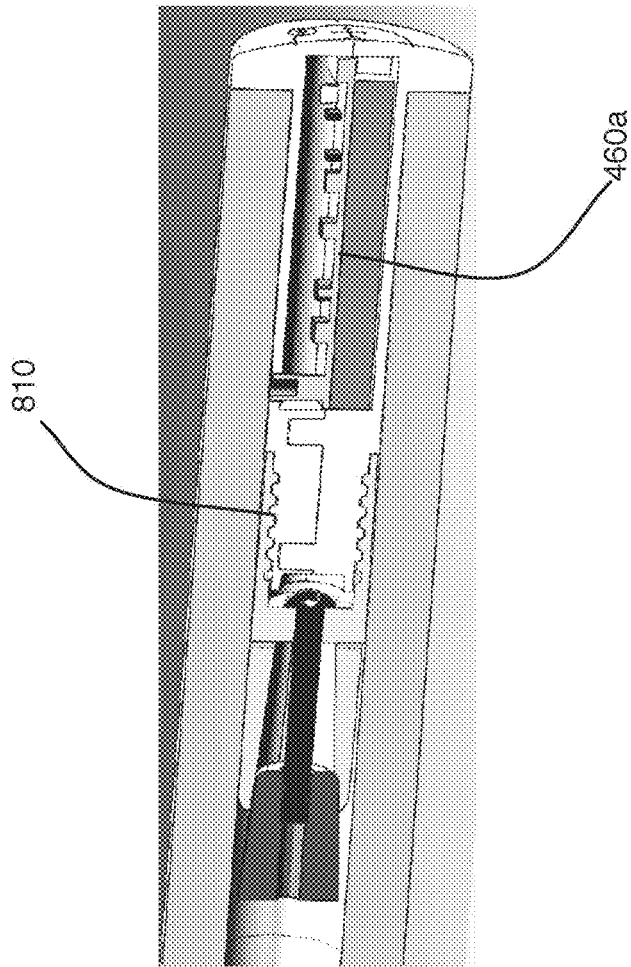
FIG. 8 illustrates a cutaway view of a second embodiment of the electronics package in longitudinal form along with a second embodiment of a coupling element.

FIG. 8 illustrates a cutaway view of a second embodiment of electronics package 460a in longitudinal form along with a second embodiment of a coupling element. Any other orientation of electronics is in keeping with the spirit of the invention so long as the mount is configured to hold the desired electronics package. Embodiments of the invention do not require modifying the piece of equipment, for example to include threads within the shaft. Embodiments of the invention also can be flush mounted with the normal end of a shaft or have any desired low profile extension from a non-instrumented club. Embodiments of the invention generally utilize a mount that is separate from the electronics so that the electronics package can be easily removed and replaced, or so that the battery can be easily removed and replaced, for example without any tools. As shown in this embodiment, a different coupling mechanism is used versus coupling points 610, namely threads 810 that engage shaft enclosure 220, which in this embodiment has corresponding threads.

Figure 9:
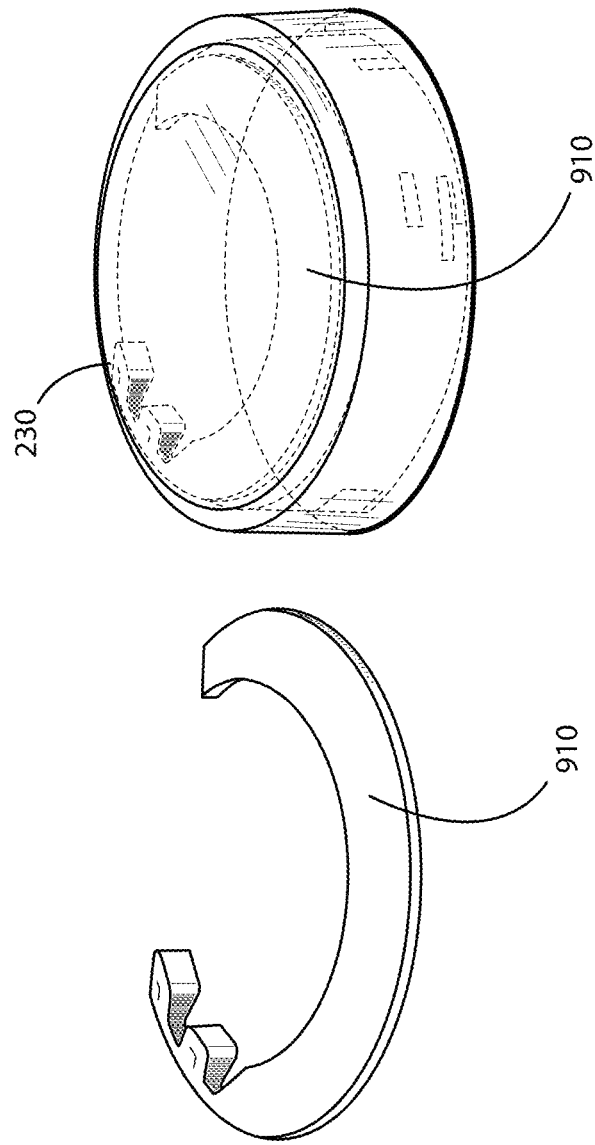
FIG. 9 illustrates an embodiment of a wireless antenna, for example a BLUETOOTH® antenna, configured to mount within the cap.

FIG. 9 illustrates an embodiment of wireless antenna 910, configured to mount within cap 230 as shown in the right portion of the figure. Alternatively, the wireless antenna may be coupled with the electronics package 460 or may include any conductive element in any shape that can radiate electromagnetic energy.

Figure 9A:
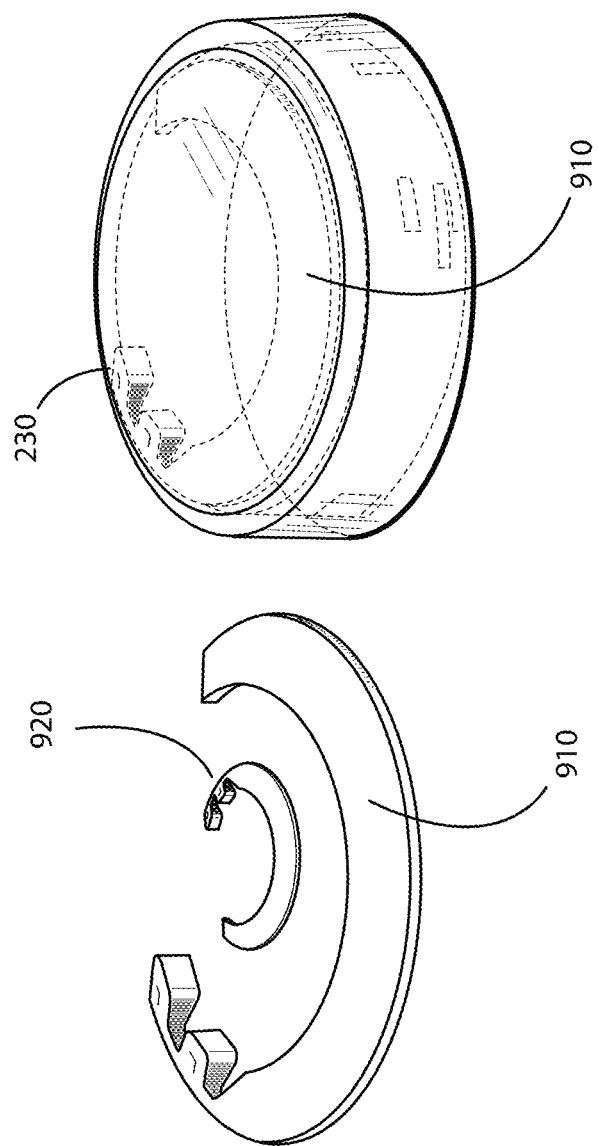
FIG. 9A illustrates an embodiment of the cap having two antennas, a wireless antenna, for example a BLUETOOTH® antenna and a GPS antenna.

FIG. 9A illustrates an embodiment of the cap having two antennas, a wireless antenna, for example a BLUETOOTH® antenna and a GPS antenna 920. The GPS antenna is optional and may be mounted in cap 230 as wireless antenna 910 is, or may be implemented in a different form factor or coupled with the PCB in any direct or indirect manner as one skilled in the art will appreciate. See also FIG. 18 for another embodiment of the antenna configuration.

Figure 10:
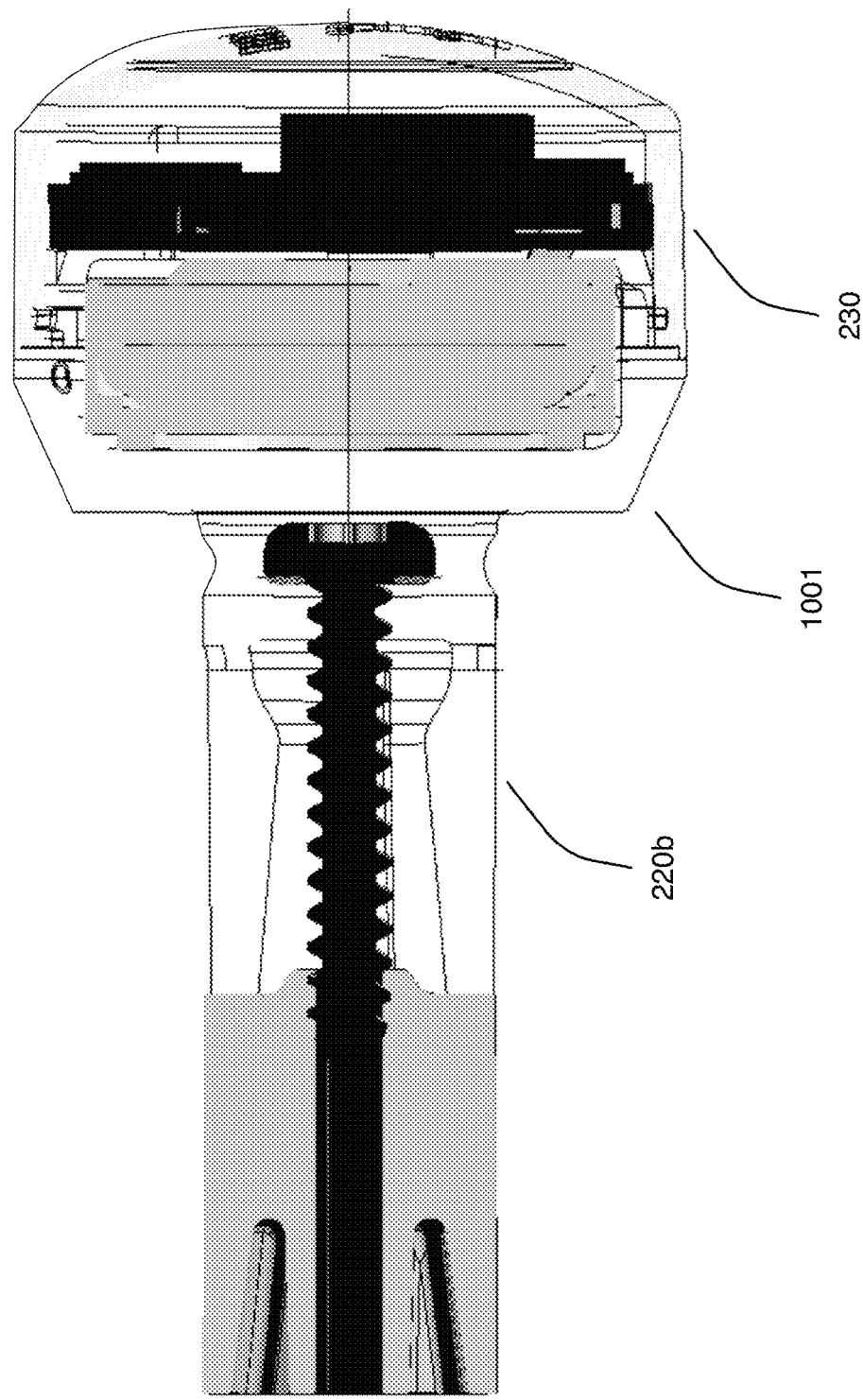
FIG. 10 shows an embodiment of the shaft enclosure having an angled area. The shaft enclosure couples with cap as is shown in the right portion of the figure.

FIG. 10 shows an embodiment of shaft enclosure 220b with angled area 1001. Shaft enclosure 220b couples with cap 230 as is shown in the right portion of the figure. Any other embodiment of the shaft enclosure detailed herein may be utilized on a shaft having a grip that either includes a hole or that does not include a hole and that wraps partially or fully around the motion capture element.

Figure 11:
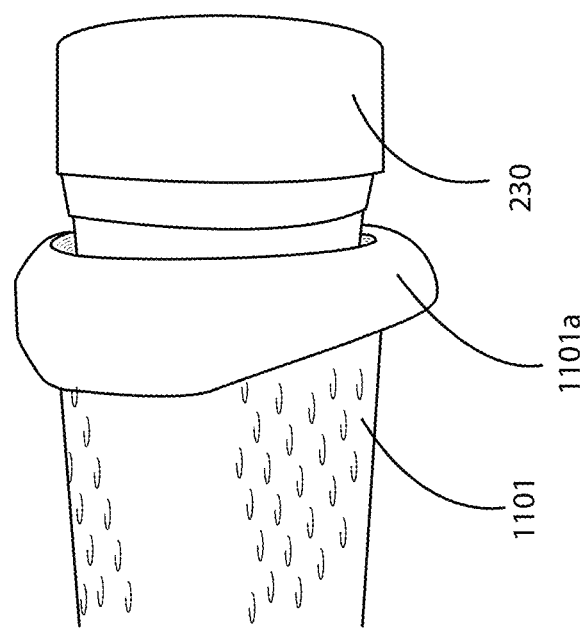
FIG. 11 shows an embodiment of the grip, for example having a hole in the top of the grip that allows for the grip to be rolled down the shaft as is shown and enabling access to the cap without removing the grip from the shaft.

FIG. 11 shows grip 1101, having a hole in the top of the grip that allows for the grip to be rolled down the shaft as is shown at area 1101a. This enables cap 230 to be exposed, removed or otherwise accessed without removing the grip from the piece of equipment for example.

Figure 12:
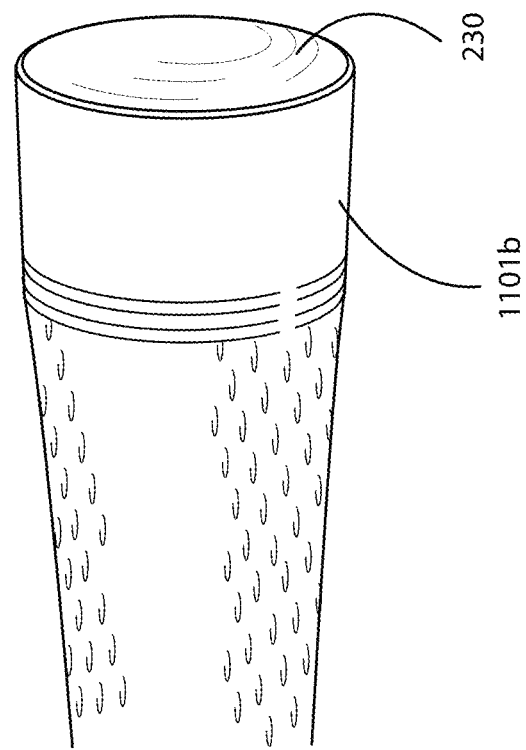
FIG. 12 shows the grip rolled back over the angled area and onto the side portions of the cap. This enables the end of the cap to be seen through the hole in the end of the grip, and enables the grip to provide extra support for the motion capture element.

FIG. 12 shows grip at area 1101b rolled back over angled area 1001 and onto the side portions of cap 230. This enables the end of the cap 230 to be seen through the hole in the end of the grip, and enables the grip to provide extra support for the motion capture element.

Figure 13:
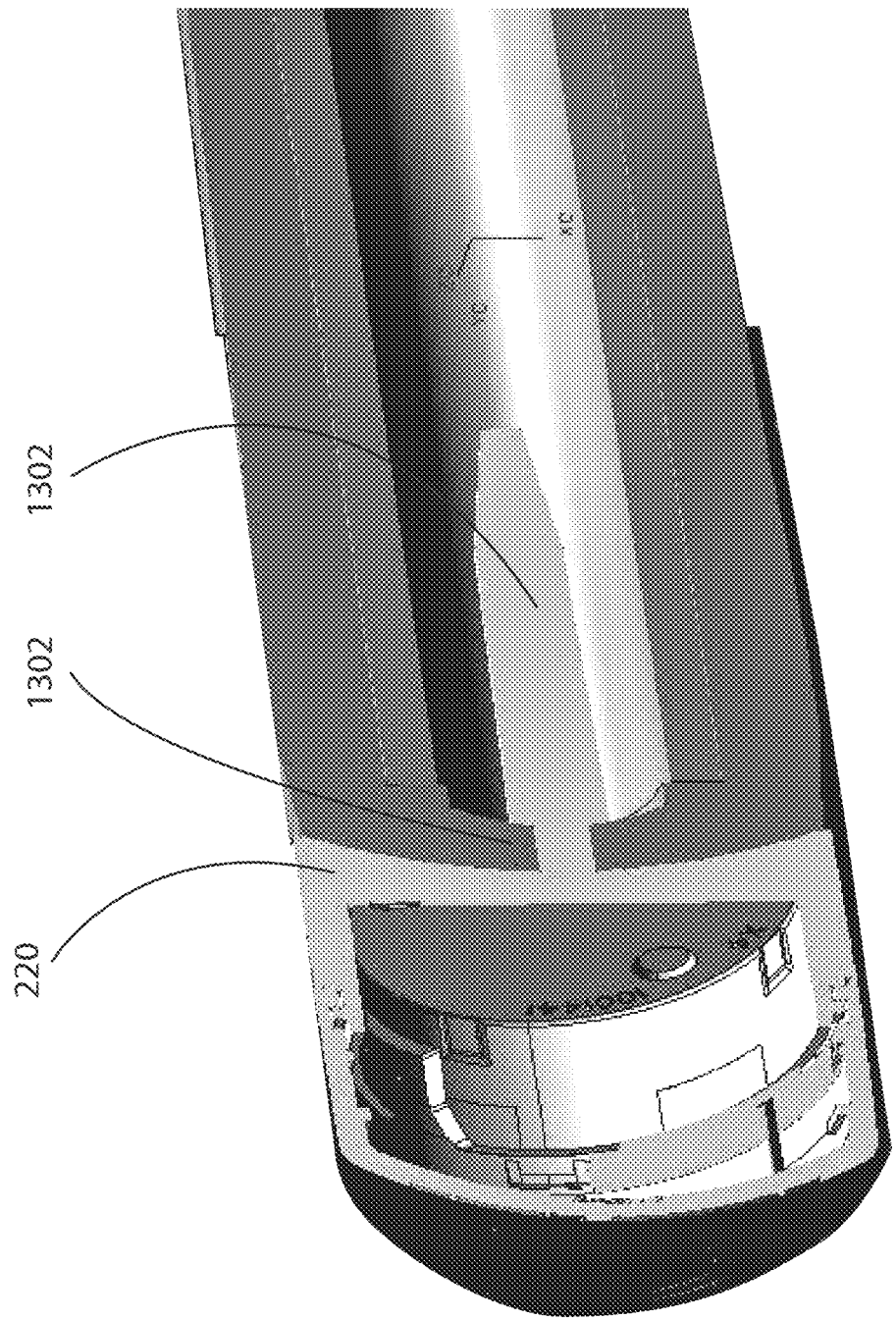
FIG. 13 illustrates a spear collet cutaway view of an embodiment of the invention.

FIG. 13 illustrates a spear collet cutaway view of an embodiment of the invention. Spear 1301 couples enclosure 220 with the hole 1302 in the handle-based piece of equipment. The spear has a narrower portion shown at the hole, but this is not required so long as the spear is capable of holding enclosure 220 to the handle.

Figure 14:
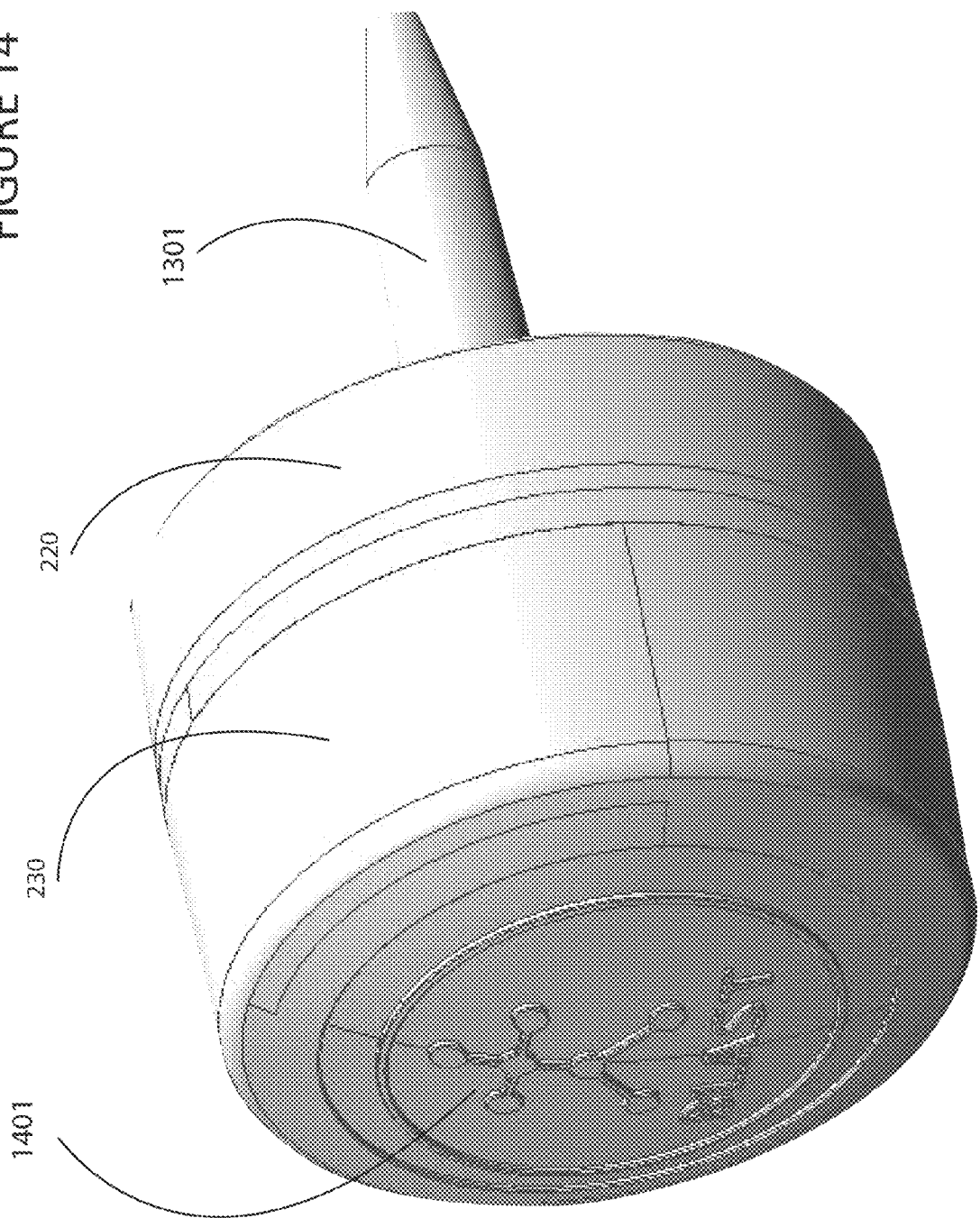
FIG. 14 illustrates a rear perspective view of the embodiment shown in FIG. 13.

FIG. 14 illustrates a rear perspective view of the embodiment shown in FIG. 13. As shown, visual marker 1401 for motion capture detection via visual methods is shown on cap 230 of enclosure 220.

Figure 15:
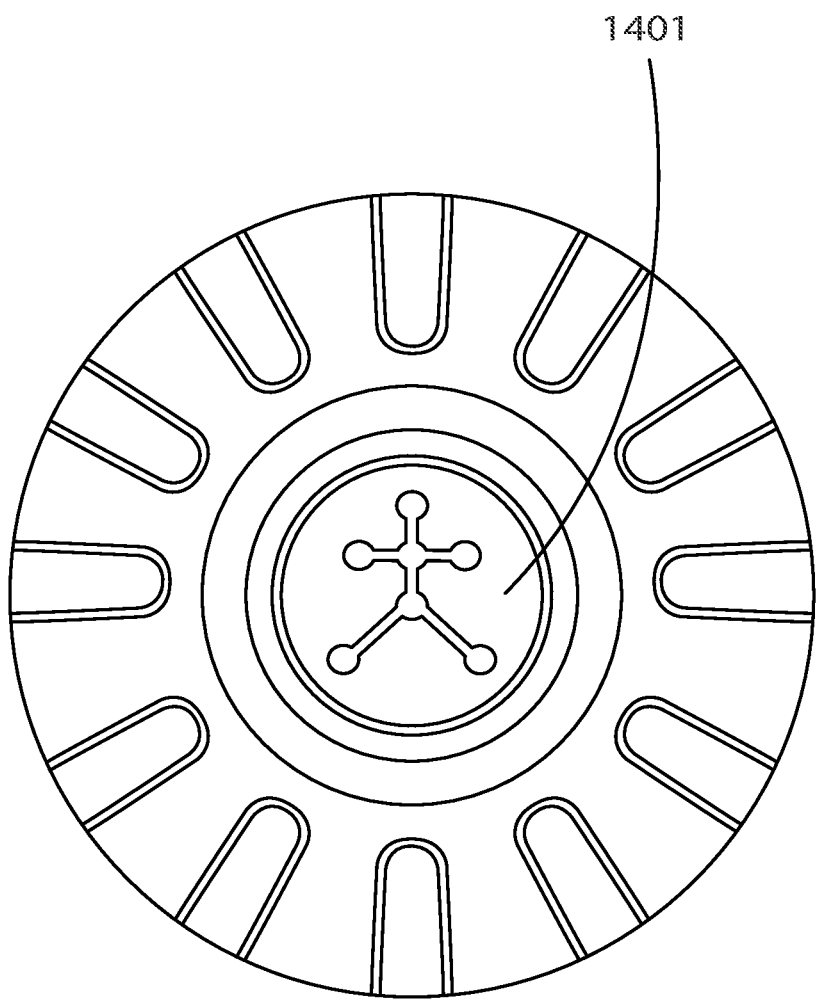
FIG. 15 illustrates a handle-based embodiment of the invention.

FIG. 15 illustrates a handle-based embodiment of the invention. As shown, visual marker 1401 is visible and in one or more embodiment may contain high contrast or active elements to enable easier visual detection of the orientation and/or motion of the motion capture sensor for example with a camera. The embodiment shown may be coupled with a baseball bat or other handle based piece of equipment for example.

Figure 16:
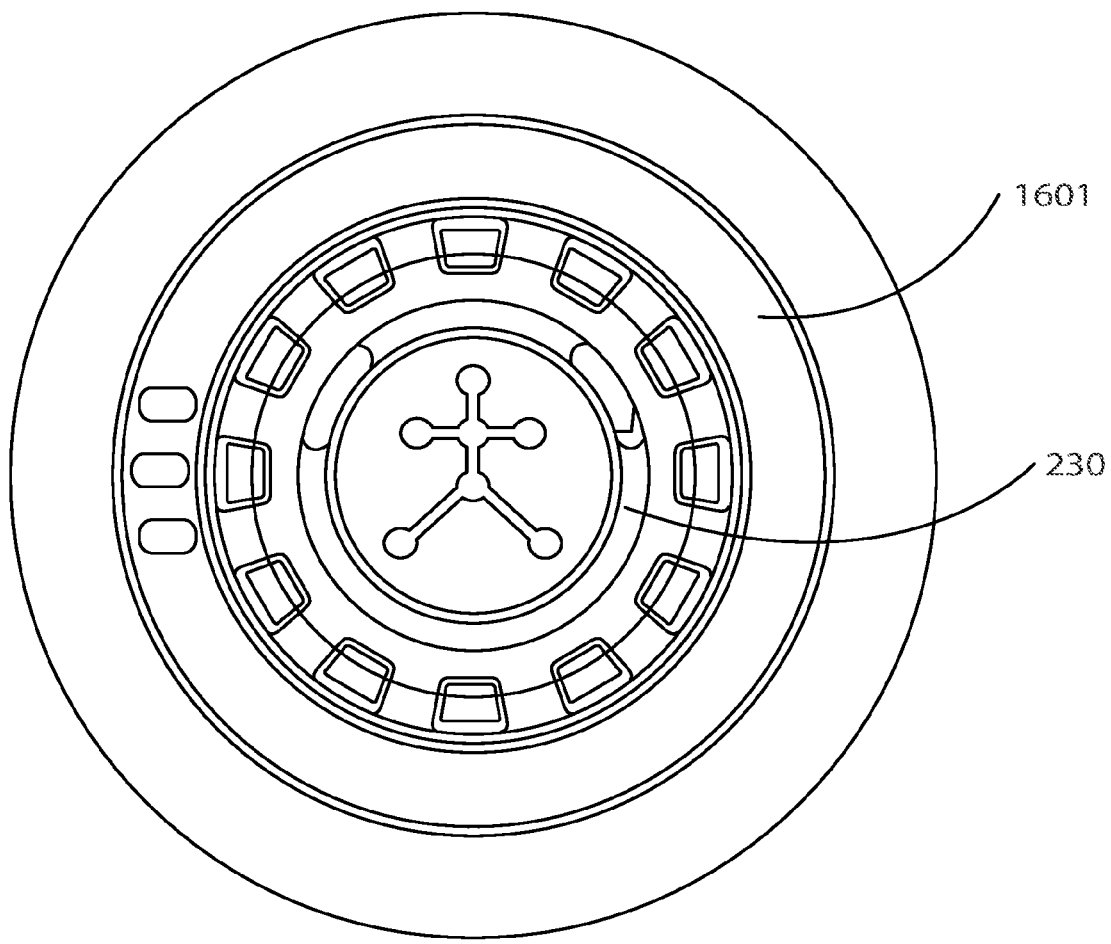
FIG. 16 illustrates a structural view of another handle-based embodiment of the invention.

FIG. 16 illustrates a structural view of another handle-based embodiment of the invention. As shown, cap 230, which covers the enclosure, is isolated from the piece of equipment via shock puck 1601. Shock puck 1601 may include any material that dampens or otherwise limits G-forces from the piece of equipment to assert force on the motion capture sensor.

Figure 17:
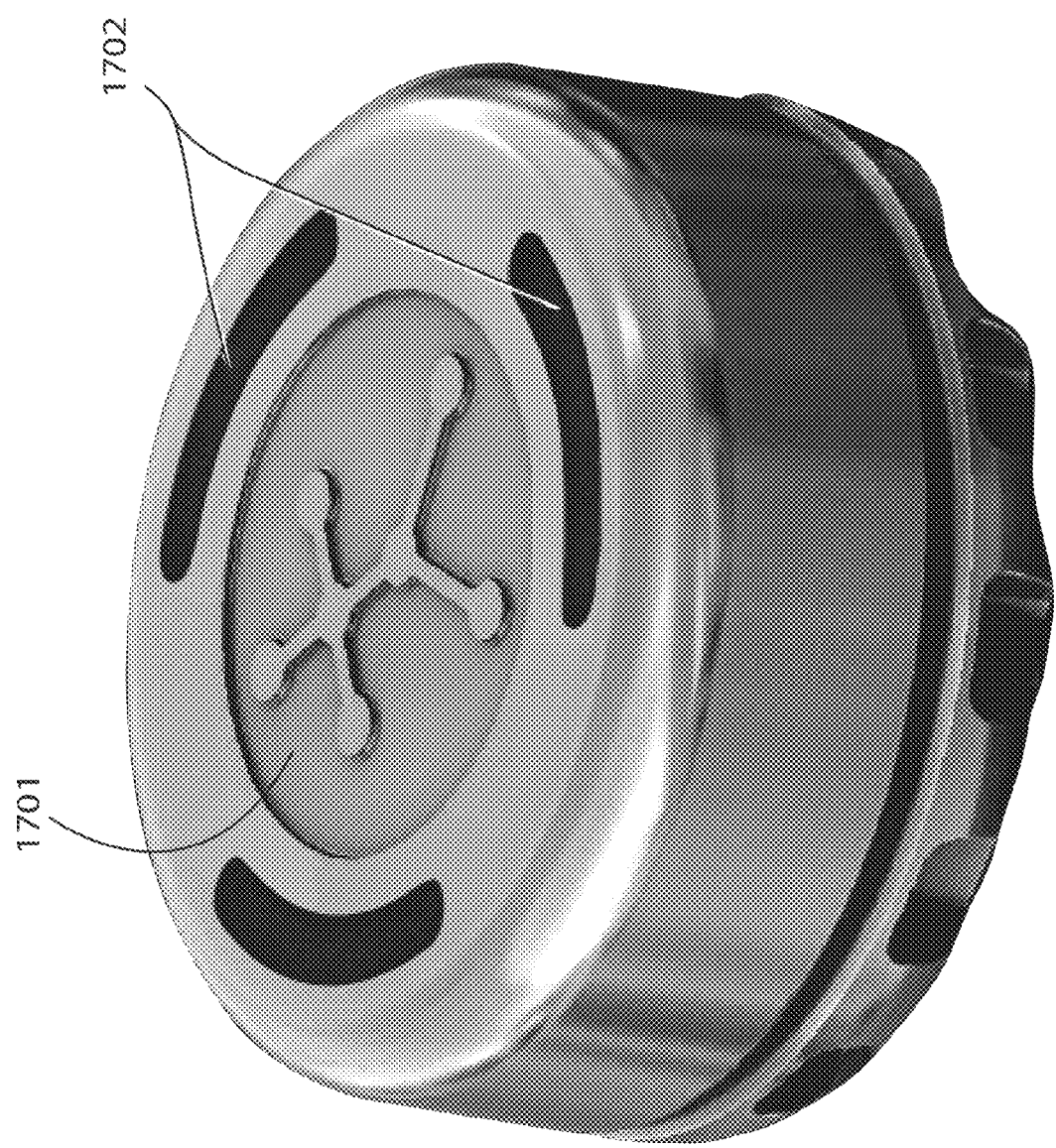
FIG. 17 illustrates another handle-based embodiment of the invention.

FIG. 17 illustrates another handle-based embodiment of the invention. As shown, uncovered portion 1701 may be utilized to house an antenna external to the inside portion of the enclosure. In one or more embodiments, areas 1702 may be made from any material that enables radio frequency waves to emanate from the internal volume of the enclosure. Alternatively, or in combination, the uncovered portion may provide an area for a small antenna that is then covered for protection as is shown in the next figure.

Figure 18:
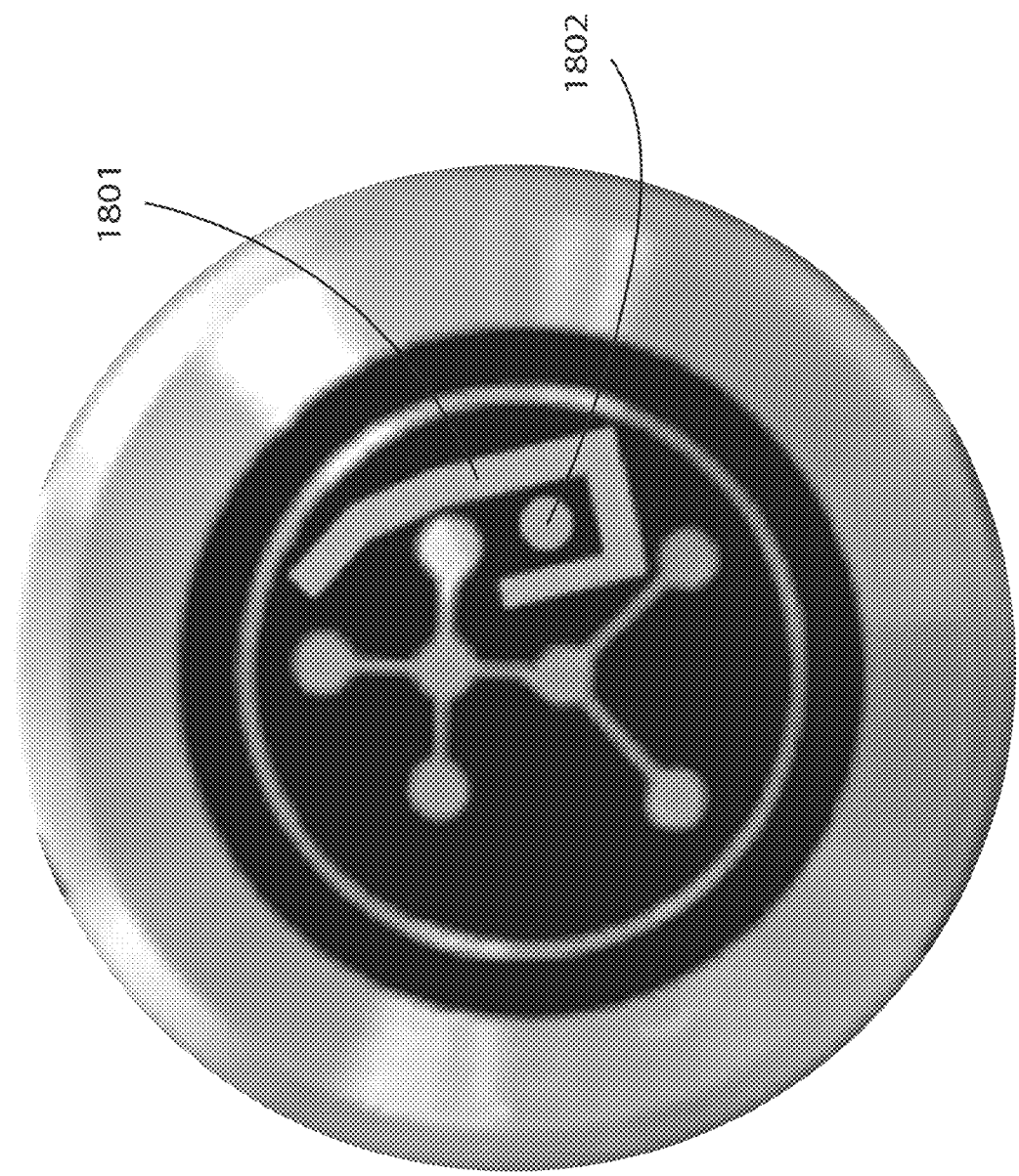
FIG. 18 illustrates the handle-based embodiment of the invention of FIG. 17 showing the location of the antenna on the outer portion of the enclosure.

FIG. 18 illustrates the handle-based embodiment of the invention of FIG. 17 showing the location of the antenna on the outer portion of the enclosure. As shown, antenna 1801 may be placed in the uncovered portion 1701 as shown in FIG. 17, which is shown in this figure partially filled with epoxy. Two holes may be drilled through the cap to provide feed lines for antenna 1801 and also for ground point 1802. The antenna and ground point may be covered as is shown in the next figure. Embodiments of the enclosure that are metallic and for example behave as an electromagnetic shield may utilize this type of antenna and provide for an extremely durable enclosure and exceptional antenna coverage for example.

Figure 19:
FIG. 19 illustrates the embodiment of FIG. 17 with the antenna shown in FIG. 18 covered with non-conductive material.

FIG. 19 illustrates the embodiment of FIG. 17 with the antenna shown in FIG. 18 covered with non-conductive material. As shown, the uncovered portion shown in FIG. 17 is covered at 1901 for example, and flush with the other portions of the cap to provide a finished cap for the enclosure that provides maximal antenna covered, while still providing a visual marker for bot electronic and visual motion capture sensing capabilities.

Figure 20:
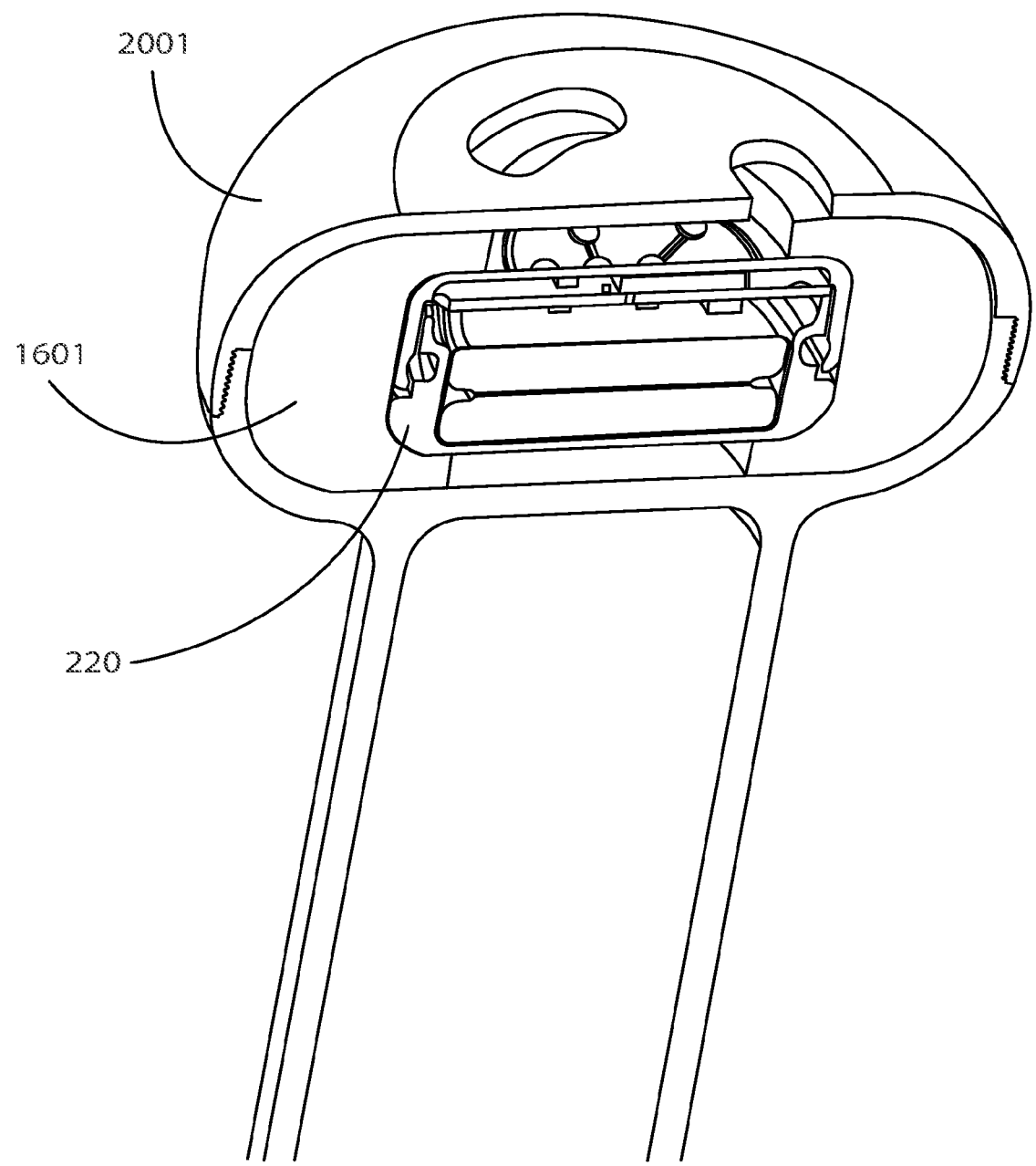
FIG. 20 illustrates a cutaway view of an embodiment of the invention coupled with a piece of equipment having a handle.

FIG. 20 illustrates a cutaway view of an embodiment of the invention coupled with a piece of equipment having a handle. As shown, shock puck 1601 surrounds enclosure 220 to provide high G-force shock protection to the internal components of the motion capture sensor. One or more embodiments of the invention may be covered with an outer protective area 2001, which may be transparent in one or more embodiments.

Figure 21:
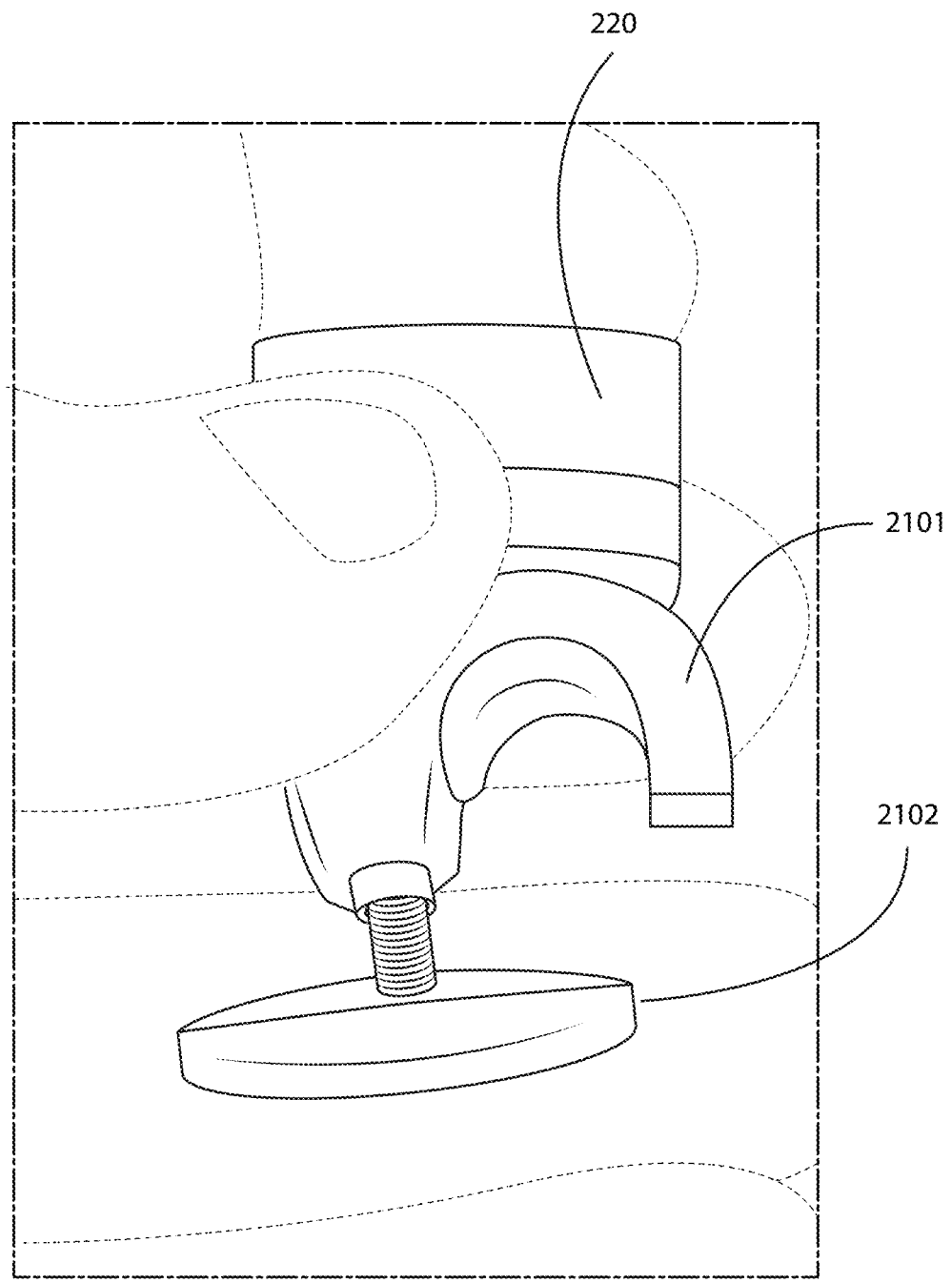
FIG. 21 illustrates an embodiment of the invention configured to couple with a helmet.

FIG. 21 illustrates an embodiment of the invention configured to couple with a helmet. As shown, enclosure 220 couples with mount 2101 that includes a half circle opening for example that may be fit around a helmet facemask tube or grill. Screw 2102 may be tightened to close the gap between the mount and the screw backing to couple enclosure 220 to a helmet.

Figure 22:
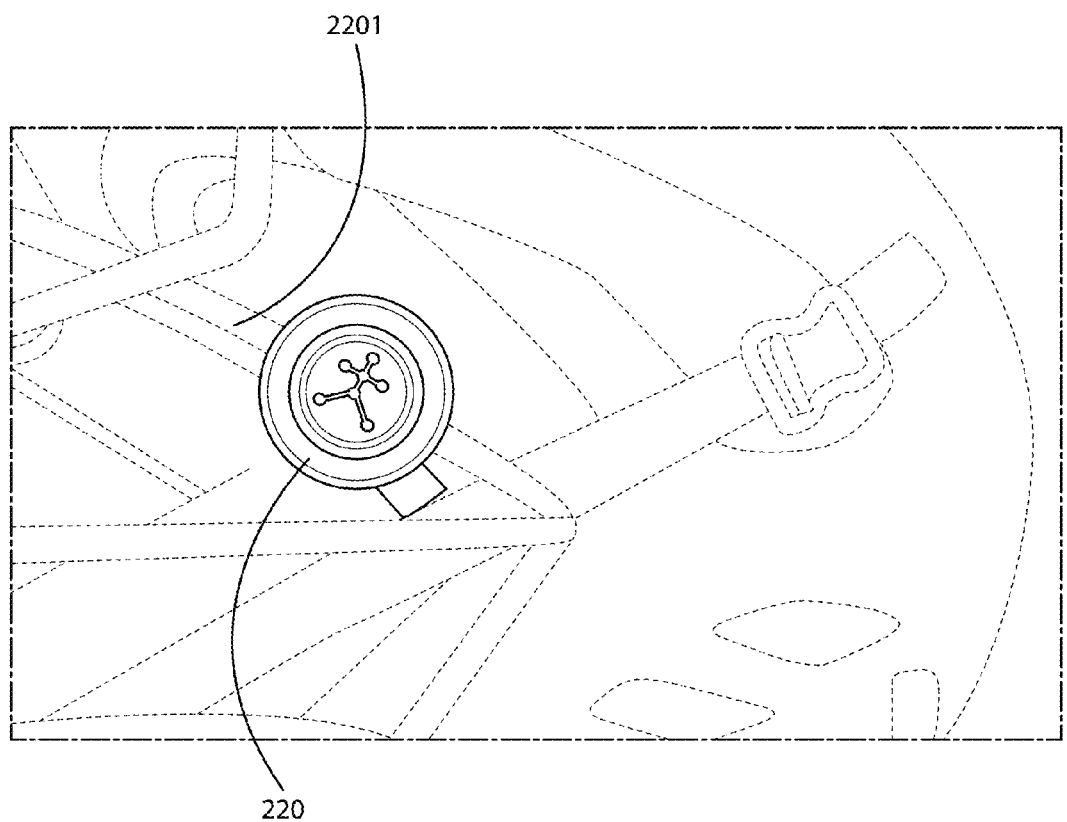
FIG. 22 illustrates the embodiment shown in FIG. 21 coupled with the helmet.

FIG. 22 illustrates the embodiment shown in FIG. 21 coupled with the helmet. As shown, enclosure 220 is coupled with helmet via facemask tube or grill 2201 as per the elements shown in FIG. 21. Any other method of coupling the enclosure with a helmet is in keeping with the spirit of the invention.

Figure 23:
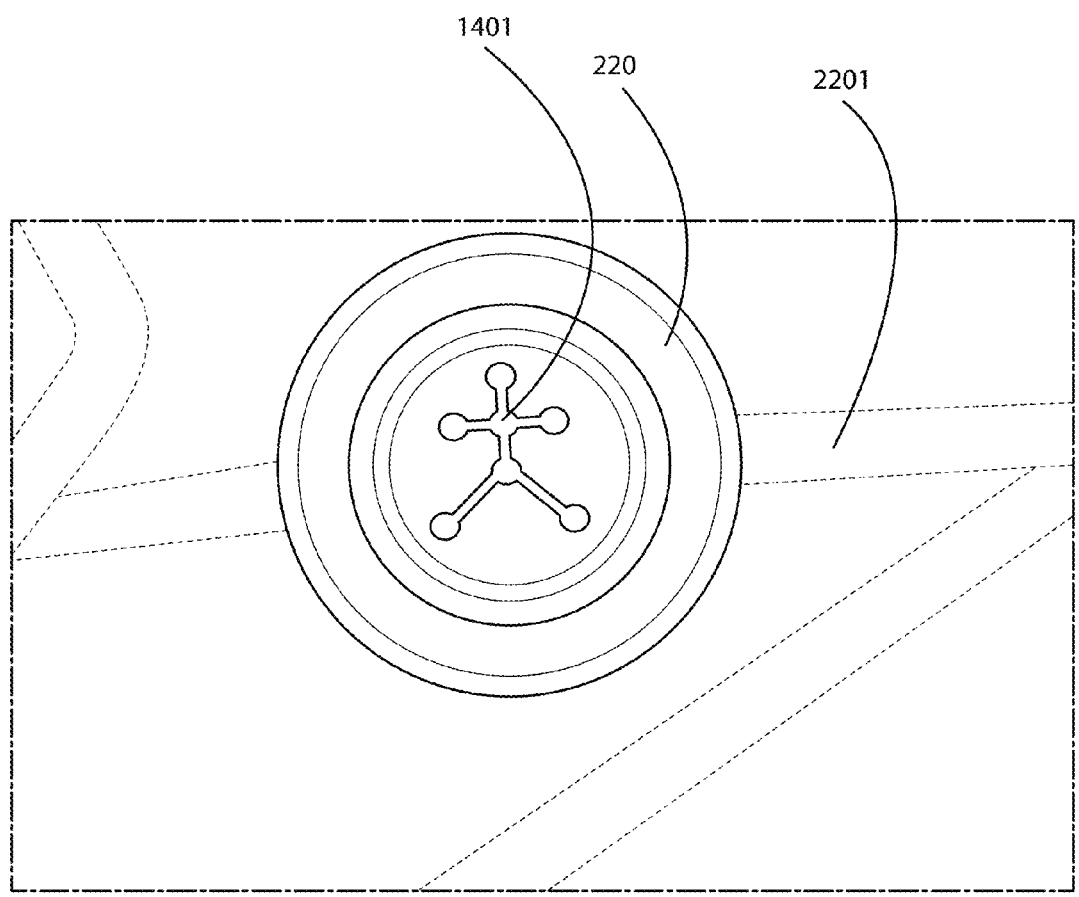
FIG. 23 illustrates a close-up of the embodiment shown in FIG. 22.

FIG. 23 illustrates a close-up of the embodiment shown in FIG. 22. Visual marker 1401 is shown on the outside portion of the helmet for use in capturing motion with an external camera for example.

Figure 24:
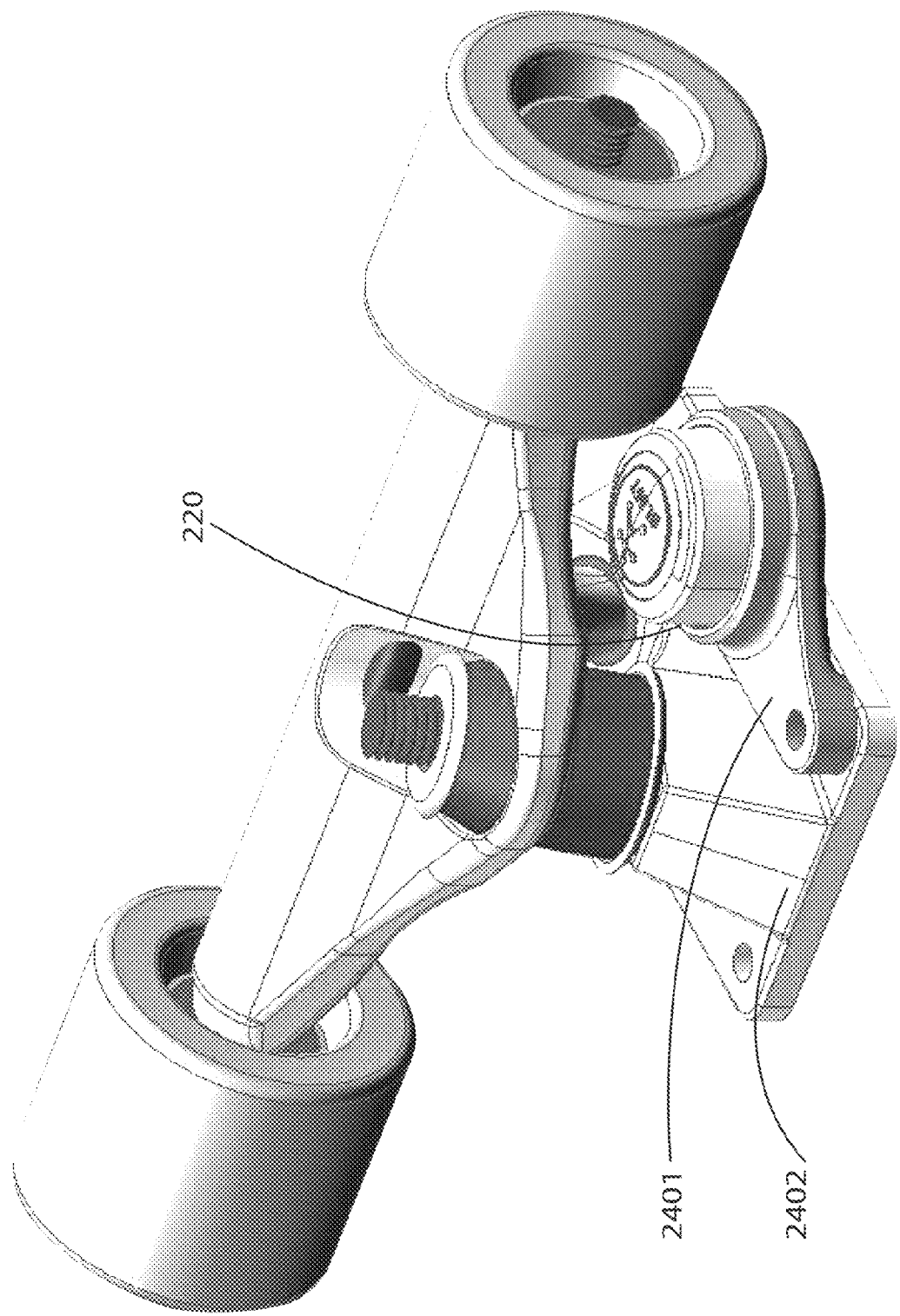
FIG. 24 illustrates a perspective view of an embodiment of the invention coupled with a skateboard truck.

FIG. 24 illustrates a perspective view of an embodiment of the invention coupled with a skateboard truck. As shown, enclosure 220 couples with or otherwise includes mount 2401 that is configured to couple with the existing screws of a skateboard truck mount 2402. Thus no extra holes are required for mounting an embodiment of the invention to a skateboard. The same configuration may be reshaped to fit holes associated with a snowboard binding or other planar oriented piece of equipment including skis as is shown in the next figure.

Figure 25:
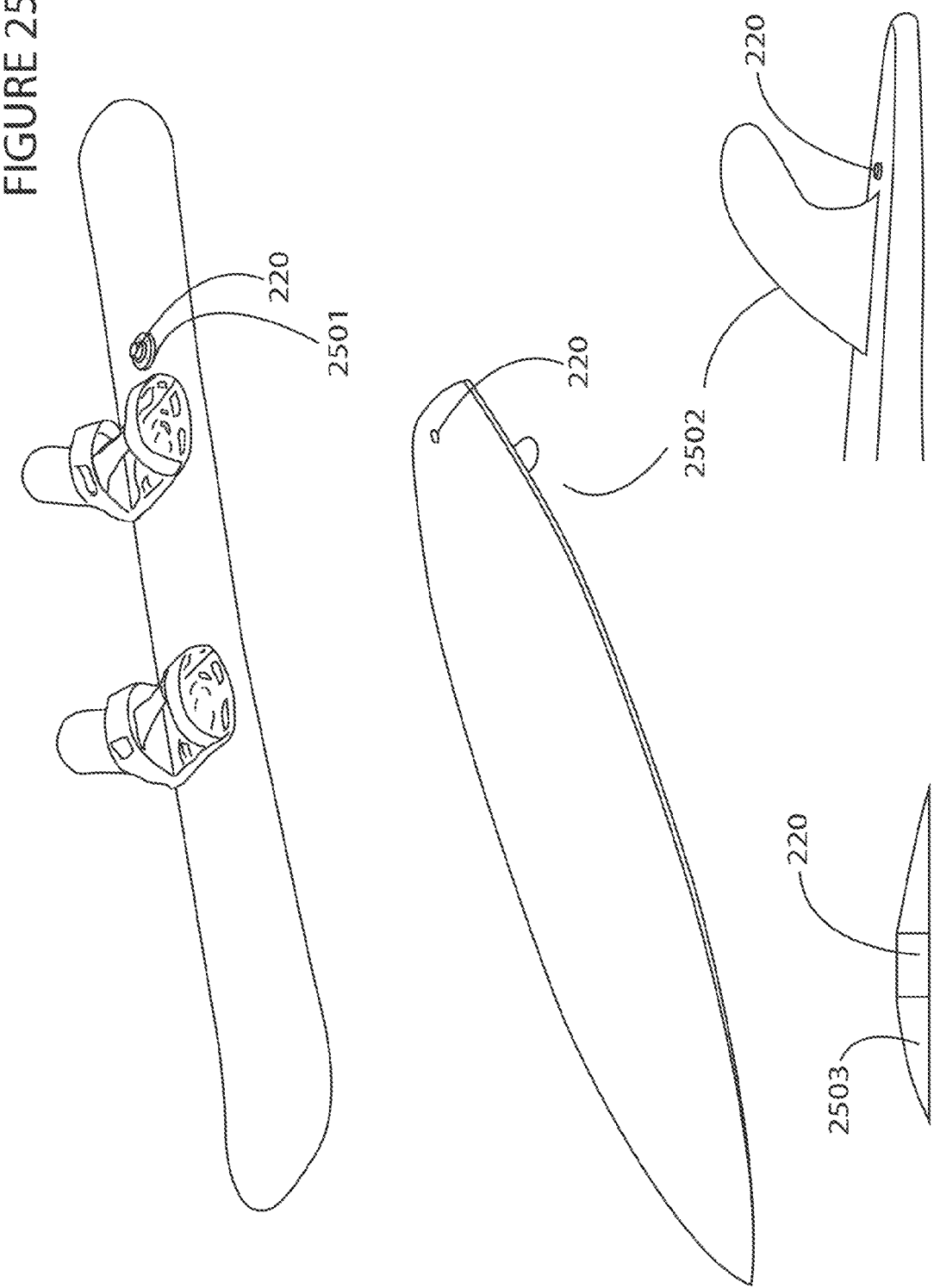
FIG. 25 illustrates an embodiment coupled with planar equipment.

FIG. 25 illustrates an embodiment coupled with planar equipment. As shown, enclosure 220 may be mounted along with the snowboard binding 2501 of a snowboard. In one or more embodiments, the enclosure may be coupled with the snowboard mount itself, or utilize a flat version of mount 2401 to couple with an existing screw used to mount the binding. As shown in the lower portion of the figure, enclosure 220 may mount on or near the top of the surfboard or on the underside of the surfboard near the skeg 2502 since surfboards may be made from materials that enable the transmission of electromagnetic waves. In one or more embodiments enclosure 220 may be housed in streamlined mount 2503 and adhesively mounted to any planar equipment, for example the snowboard, surfboard or skis. Streamlined mounts provide low wind or water drag and minimize interference with external objects for example.

While the ideas herein disclosed has been described by means of specific embodiments and applications thereof, numerous modifications and variations could be made thereto by those skilled in the art without departing from the scope of the invention set forth in the claims.

What is claimed is:
1. A motion capture element mount system comprising:
   an enclosure configured to house a motion capture sensor with internal components;
   a mount coupled with said enclosure and configured to couple said enclosure to a piece of equipment;

a cap coupled with said enclosure wherein said cap comprises a visual marker configured to enable visually capturing motion of said enclosure and motion capture sensor;
  wherein said visual marker is coupled with an outer portion of said cap, wherein said visual marker comprises a plurality of positionally offset visual elements positioned on a background color,
    wherein said plurality of positionally offset visual elements are arranged in a non-linear pattern and are offset from each other,
    wherein said plurality of positionally offset visual elements comprises positionally offset dots or non-parallel lines or both said positionally offset dots and said non-parallel lines,
    wherein the plurality of positionally offset visual elements comprise only one unique 360 degree pattern that enables visual determination of a rotational orientation unique within 360 degrees of the visual marker from a point orthogonal to a plane that passes through the plurality of positionally offset visual elements, such that said visual determination of the visual marker is enabled with only one unique rotation of the plurality of positionally offset visual elements,
    wherein each of said plurality of positionally offset visual elements comprise differing visual characteristics than said background color, and,
  wherein said visual marker is further configured enable an external camera to visually track said at least one sensor
    to determine position and distance to said visual marker, and
    to determine a rotational characteristic of said visual marker; and,
a shock puck comprising a material configured to
  dampen or limit G-forces,
  surround said enclosure, shield said enclosure from said G-forces,
  protect said internal components of said motion capture sensor, and,
  assert force on said motion capture sensor;
wherein said cap covers said enclosure; and,
wherein said cap is isolated from said piece of equipment via said shock puck.

2. The system of claim 1 wherein said mount is configured to couple with said piece of equipment without modification of said piece of equipment.

3. The system of claim 1 further comprising:
a grip configured to engage said side portion of said cap and to roll down said cap to enable said cap to be exposed without removing said grip; and,
said enclosure configured to non-permanently couple with said cap.

4. The system of claim 1 further comprising:
an antenna coupled with an outer portion of said enclosure wherein said enclosure is an electromagnetic shield.

5. The system of claim 1 wherein said mount is streamlined and configured to provide low wind or water drag.

6. The system of claim 1 further comprising:
electrical components comprising
  a positive battery contact;
  an insulator that is electrically insulative;
  a negative battery contact;
  an electronics package;
  a z antenna; and,
wherein said enclosure and said cap are configured to internally hold said electrical components.

7. The system of claim 1 wherein said electrical components are removable to comply with sporting regulations.

8. The system of claim 1 further comprising:
a weight element; and,
wherein said enclosure and said cap are further configured to internally hold said weight element when at least one of said electrical components is removed and wherein said weight element is configured to weigh an amount that minimizes a difference in weight between said at least one of said electrical components that is removed and said weight element.

9. The system of claim 1 wherein said piece of equipment is a piece of sporting, exercise or medical rehabilitation equipment, baseball bat, hockey stick, lacrosse stick, helmet, skateboard, ski, snowboard, surfboard, golf club, tennis racquet, or weight training bar, and wherein said mount comprises a spear collet or is configured to couple to said piece of equipment via at least one screw.

10. The system of claim 1 further comprising:
an identifier coupled with said electronics package associated with a golf club number.

11. The system of claim 1 further comprising:
an identifier coupled with said electronics package associated with a golf club number wherein said identifier is passive and is configured to operate without contact with a battery or wherein said identifier is active and is configured to couple with a battery.

12. A motion capture element mount system comprising:
an enclosure configured to house a motion capture sensor with internal components;
a mount coupled with said enclosure and configured to couple said enclosure to a piece of equipment;
a cap coupled with said enclosure wherein said cap comprises a visual marker configured to enable visually capturing motion of said enclosure and motion capture sensor;
  wherein said visual marker is coupled with an outer portion of said cap, wherein said visual marker comprises a plurality of positionally offset visual elements positioned on a background color,
    wherein said plurality of positionally offset visual elements are arranged in a non-linear pattern and are offset from each other,
    wherein said plurality of positionally offset visual elements comprises positionally offset dots or non-parallel lines or both said positionally offset dots and said non-parallel lines,
    wherein the plurality of positionally offset visual elements comprise only one unique 360 degree pattern that enables visual determination of a rotational orientation unique within 360 degrees of the visual marker from a point orthogonal to a plane that passes through the plurality of positionally offset visual elements, such that said visual determination of the visual marker is enabled with only one unique rotation of the plurality of positionally offset visual elements,
    wherein each of said plurality of positionally offset visual elements comprise differing visual characteristics than said background color, and,
  wherein said visual marker is further configured enable an external camera to visually track said at least one sensor
    to determine position and distance to said visual marker, and to determine a rotational characteristic of said visual marker;
electrical components comprising
a positive battery contact;
an insulator that is electrically insulative;
a negative battery contact;
an electronics package; and,
a shock puck comprising a material configured to
dampen or limit G-forces,
surround said enclosure,
shield said enclosure from said G-forces,
protect said internal components of said motion capture sensor, and,
assert force on said motion capture sensor;
wherein said cap covers said enclosure;
wherein said cap is isolated from said piece of equipment via said shock puck; and,
wherein said enclosure and said cap are configured to internally hold said positive battery contact, said insulator, said negative battery contact and said electronics package.

13. The system of claim 12 wherein said mount is configured to couple with said piece of equipment without modification of said piece of equipment and wherein said piece of equipment is a piece of sporting, exercise or medical rehabilitation equipment, baseball bat, hockey stick, lacrosse stick, helmet, skateboard, ski, snowboard, surfboard, golf club, tennis racquet, or weight training bar, and wherein said mount comprises a spear collet or is configured to couple to said piece of equipment via at least one screw.

14. The system of claim 12 further comprising:
an antenna coupled with an outer portion of said enclosure wherein said enclosure is an electromagnetic shield.

15. The system of claim 12 wherein said mount is streamlined and configured to provide low wind or water drag.

16. The system of claim 12 wherein said electrical components are removable to comply with sporting regulations.

17. The system of claim 12 further comprising:
a weight element;
wherein said shaft enclosure and said cap are further configured to internally hold said weight element when at least one of said electrical components is removed and wherein said weight element is configured to weigh an amount that minimizes a difference in weight between said at least one of said electrical components that is removed and said weight element.

18. The system of claim 12 further comprising:
an identifier coupled with said electronics package and configured to identify said piece of equipment.

19. A motion capture element mount system comprising:
an enclosure configured to house a motion capture sensor with internal components;
a mount coupled with said enclosure and configured to couple said enclosure to a piece of equipment wherein said mount is configured to couple with said piece of equipment without modification of said piece of equipment;
a cap coupled with said enclosure wherein said cap comprises a visual marker configured to enable visually capturing motion of said enclosure and motion capture sensor;
wherein said visual marker is coupled with an outer portion of said cap, wherein said visual marker comprises a plurality of positionally offset visual elements positioned on a background color,
wherein said plurality of positionally offset visual elements are arranged in a non-linear pattern and are offset from each other,
wherein said plurality of positionally offset visual elements comprises positionally offset dots or non-parallel lines or both said positionally offset dots and said non-parallel lines,
wherein the plurality of positionally offset visual elements comprise only one unique 360 degree pattern that enables visual determination of a rotational orientation unique within 360 degrees of the visual marker from a point orthogonal to a plane that passes through the plurality of positionally offset visual elements, such that said visual determination of the visual marker is enabled with only one unique rotation of the plurality of positionally offset visual elements,
wherein each of said plurality of positionally offset visual elements comprise differing visual characteristics than said background color, and,
wherein said visual marker is further configured enable an external camera to visually track said at least one sensor
to determine position and distance to said visual marker, and
to determine a rotational characteristic of said visual marker;
electrical components comprising
a positive battery contact;
an insulator that is electrically insulative;
a negative battery contact;
an electronics package;
an identifier coupled with said electronics package and configured to identify said piece of equipment;
an antenna coupled with said electronics package;
a shock puck comprising a material configured to
dampen or limit G-forces,
surround said enclosure,
shield said enclosure from said G-forces,
protect said internal components of said motion capture sensor, and,
assert force on said motion capture sensor;
wherein said cap covers said enclosure;
wherein said cap is isolated from said piece of equipment via said shock puck;
wherein said enclosure and said cap are configured to internally hold said positive battery contact, said insulator, said negative battery contact and said electronics package; and,
wherein said piece of equipment is a piece of sporting, exercise or medical rehabilitation equipment, baseball bat, hockey stick, lacrosse stick, helmet, skateboard, ski, snowboard, surfboard, golf club, tennis racquet, or weight training bar, and wherein said mount comprises a spear collet or is configured to couple to said piece of equipment via at least one screw.

20. The system of claim 1 wherein a symmetry group of the plurality of positionally offset visual elements contains only an identity function.

* * * * *